United States Patent
Lin et al.

(10) Patent No.: US 10,515,846 B2
(45) Date of Patent: *Dec. 24, 2019

(54) SYSTEMS AND METHODS FOR A SEMICONDUCTOR STRUCTURE HAVING MULTIPLE SEMICONDUCTOR-DEVICE LAYERS

(71) Applicant: Taiwan Semiconductor Manufacturing Company Limited, Hsinchu (TW)

(72) Inventors: Yi-Tang Lin, Hsinchu (TW); Chun Hsiung Tsai, Hsinchu County (TW); Clement Hsingjen Wann, New York, NY (US)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/113,406

(22) Filed: Aug. 27, 2018

(65) Prior Publication Data

US 2018/0374742 A1  Dec. 27, 2018

Related U.S. Application Data

(63) Continuation of application No. 15/588,917, filed on May 8, 2017, now Pat. No. 10,062,601, which is a
(Continued)

(51) Int. Cl.
*H01L 29/00* (2006.01)
*H01L 21/762* (2006.01)
(Continued)

(52) U.S. Cl.
CPC ...... *H01L 21/76251* (2013.01); *H01L 21/761* (2013.01); *H01L 27/0629* (2013.01);
(Continued)

(58) Field of Classification Search
CPC ........... H01L 27/1203; H01L 29/78603; Y10S 977/712
See application file for complete search history.

(56) References Cited

U.S. PATENT DOCUMENTS

| 6,180,463 | B1 | 1/2001 | Otsuki |
| 9,165,926 | B2 | 10/2015 | Lee |

(Continued)

FOREIGN PATENT DOCUMENTS

| KR | 20010070316 | 7/2001 |
| KR | 20100094905 | 8/2010 |

(Continued)

OTHER PUBLICATIONS

Korean Notice of Allowance, Application No. 10-2014-0149598, 3 pages. Feb. 1, 2016.
(Continued)

*Primary Examiner* — Thomas L Dickey
(74) *Attorney, Agent, or Firm* — Haynes and Boone, LLP

(57) ABSTRACT

A multilayer semiconductor device structure having different circuit functions on different semiconductor device layers is provided. The semiconductor structure comprises a first semiconductor device layer fabricated on a bulk substrate. The first semiconductor device layer comprises a first semiconductor device for performing a first circuit function. The first semiconductor device layer includes a patterned top surface of different materials. The semiconductor structure further comprises a second semiconductor device layer fabricated on a semiconductor-on-insulator ("SOI") substrate. The second semiconductor device layer comprises a second semiconductor device for performing a second circuit function. The second circuit function is different from the first circuit function. A bonding surface coupled between the patterned top surface of the first semiconductor device layer and a bottom surface of the SOI substrate is included.
(Continued)

The bottom surface of the SOI substrate is bonded to the patterned top surface of the first semiconductor device layer via the bonding surface.

20 Claims, 28 Drawing Sheets

Related U.S. Application Data continuation of application No. 14/078,619, filed on Nov. 13, 2013, now Pat. No. 9,646,872.

(51) Int. Cl.
    *H01L 27/12*     (2006.01)
    *H01L 27/06*     (2006.01)
    *H01L 21/761*     (2006.01)
    *H01L 27/088*     (2006.01)
    *H01L 27/092*     (2006.01)
    *H01L 27/02*     (2006.01)

(52) U.S. Cl.
    CPC ...... *H01L 27/0688* (2013.01); *H01L 27/1207* (2013.01); *H01L 27/0251* (2013.01); *H01L 27/0886* (2013.01); *H01L 27/092* (2013.01); *H01L 27/0924* (2013.01)

(56) References Cited

U.S. PATENT DOCUMENTS

| | | |
|---|---|---|
| 9,646,872 B2 | 5/2017 | Lin et al. |
| 2001/0002329 A1 | 5/2001 | Ling |
| 2002/0000615 A1 | 1/2002 | Ma et al. |
| 2002/0036322 A1 | 3/2002 | Divakauni et al. |
| 2008/0303072 A1 | 12/2008 | Lee et al. |
| 2009/0127624 A1 | 5/2009 | Sumitomo et al. |
| 2010/0044826 A1 | 2/2010 | Farooq et al. |
| 2011/0198699 A1 | 8/2011 | Hung et al. |
| 2013/0082304 A1* | 4/2013 | Liu .................. H01L 29/66795 257/192 |
| 2013/0193526 A1 | 8/2013 | Lo et al. |
| 2015/0123202 A1 | 5/2015 | Lin et al. |
| 2015/0129968 A1 | 5/2015 | Lin et al. |
| 2017/0287773 A1 | 10/2017 | Lin et al. |

FOREIGN PATENT DOCUMENTS

| | | |
|---|---|---|
| KR | 20110095116 | 8/2011 |
| KR | 20130088704 | 8/2013 |

OTHER PUBLICATIONS

Korean Office Action; Application No. 10-2014-0149598, 17 pages. Jun. 18, 2015.

* cited by examiner

US 10,515,846 B2

SYSTEMS AND METHODS FOR A SEMICONDUCTOR STRUCTURE HAVING MULTIPLE SEMICONDUCTOR-DEVICE LAYERS

PRIORITY DATA

The present application is a continuation application of U.S. application Ser. No. 15/588,917, filed May 8, 2017, which is a continuation application of U.S. application Ser. No. 14/078,619, filed Nov. 13, 2013, each of which is hereby incorporated by reference in its entirety.

FIELD

The technology described in this patent document relates generally to semiconductor devices and more particularly to a semiconductor structure having multiple semiconductor device layers.

BACKGROUND

Integrated circuits ("ICs") may comprise one or more types of semiconductor devices such as n-channel MOSFET ("NMOS") devices, p-channel MOSFET ("PMOS") devices, bipolar junction transistor ("BJT") devices, diode devices, and capacitors devices among others. Different types of devices can present different design considerations for a semiconductor designer. ICs may also include circuits that have different circuit functions such as ICs having analog functions, logic functions and memory functions.

SUMMARY

In accordance with the teachings described herein, system and methods are provided for a semiconductor structure having multiple semiconductor device layers. In one example, a multilayer semiconductor device structure having different circuit functions on different semiconductor device layers is provided. The semiconductor structure comprises a first semiconductor device layer fabricated on a bulk substrate. The first semiconductor device layer comprises a first semiconductor device for performing a first circuit function. The first semiconductor device layer includes a patterned top surface of different materials. The semiconductor structure further comprises a second semiconductor device layer fabricated on a semiconductor-on-insulator ("SOI") substrate. The second semiconductor device layer comprises a second semiconductor device for performing a second circuit function. The second circuit function is different from the first circuit function. A bonding surface coupled between the patterned top surface of the first semiconductor device layer and a bottom surface of the SOI substrate is included. The bottom surface of the SOI substrate is bonded to the patterned top surface of the first semiconductor device layer via the bonding surface.

In another example, a method of fabricating a multilayer semiconductor device structure having different circuit functions on different semiconductor device layers is provided. The method comprises providing a bulk substrate and fabricating a first semiconductor device layer on the bulk substrate. The first semiconductor device layer comprises a first semiconductor device for performing a first circuit function. The first semiconductor device layer includes a patterned top surface of different materials. The method further comprises bonding to the patterned top surface a bottom surface of a semiconductor-on-insulator ("SOI") substrate and fabricating a second semiconductor device layer on the SOI substrate. The second semiconductor device layer comprises a second semiconductor device for performing a second circuit function. The second circuit function is different from the first circuit function. The method further comprises interconnecting a feature of the first semiconductor device with a feature of the second semiconductor device.

DETAILED DESCRIPTION

Figure 1A:
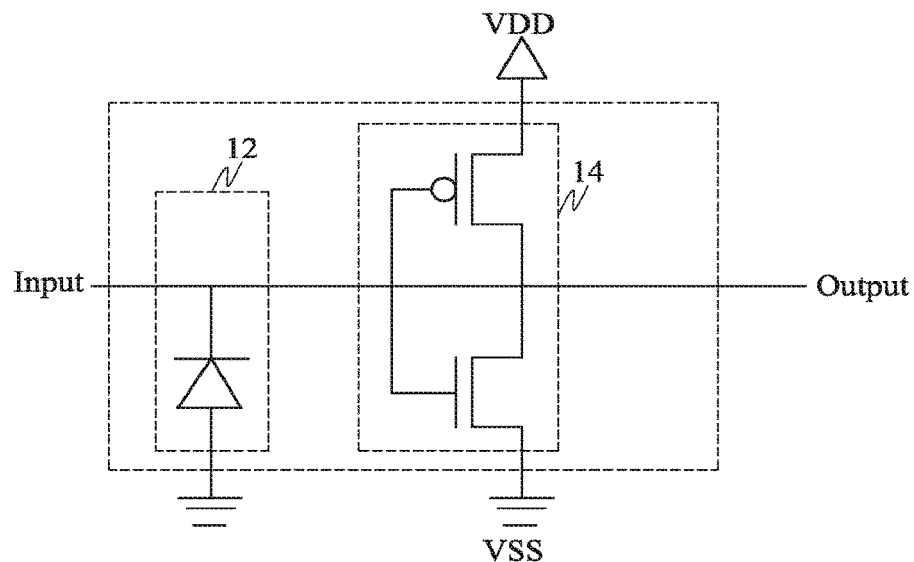
FIG. 1A is a schematic diagram of an example circuit 10 that may be implemented in a multi-layer semiconductor structure.

FIG. 1A is a schematic diagram of an example circuit 10 that may be implemented in a multi-layer semiconductor structure. The example circuit 10 has two components, an ESD protection circuit 12 and a logic main circuit 14, that perform two circuit functions. The ESD protection circuit 12 protects the logic main circuit 14 from damage due to electrostatic charges or a sudden voltage/current noise/pulse applied to an input of the logic main circuit 14. The logic main circuit 14 performs an inverter logic function for the circuit 10. In this example, the ESD protection circuit 12 comprises a diode and the logic main circuit 14 comprises a PMOS transistor and a NMOS transistor connected together as an inverter.

Figure 1B:
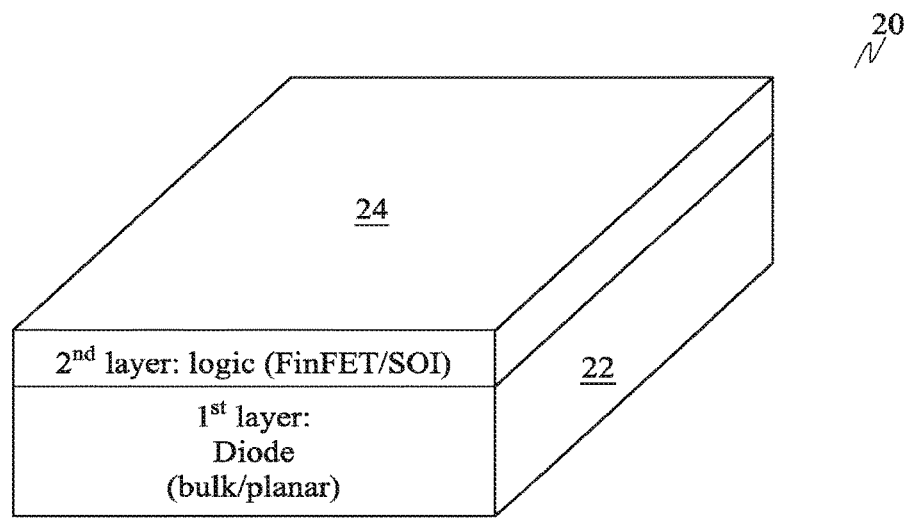
FIG. 1B is a block diagram of an example multilayer semiconductor structure 20.

FIG. 1B is a block diagram of an example multi-layer semiconductor structure 20. The multi-layer semiconductor structure 20 comprises two semiconductor device layers. The first semiconductor layer 22 is formed on a bulk substrate and the second semiconductor layer 24 is formed on a semiconductor on insulator ("SOI") substrate.

The ESD protection circuit 12 of FIG. 1A may be implemented on the bulk substrate of the first semiconductor layer 22, and the logic main circuit 14 of FIG. 1A may be implemented on the SOI substrate of the second semiconductor layer 24. Because the diode of the ESD protection circuit 12 is a vertical-junction device and can be implemented by a planar structure with N+ and P-well implantation, the ESD protection circuit 12 is suitable for fabrication on a bulk substrate and therefore is suitable for implementation in the first semiconductor layer 22. Because the inverter of logic main circuit 14 is made up of two MOSFETs and a MOSFET is a surface-charge-inversion device that is suitable for a FinFET SOI structure, the logic main circuit 14 is suitable for implementation in the second semiconductor SOI layer 24. Thus, the example circuit 10, with its two circuit functions—ESD protection circuit 12 and logic main circuit 14—can be implemented in the multi-device layer structure 20 with the two different circuit functions fabricated on different semiconductor device layers.

Figure 2:
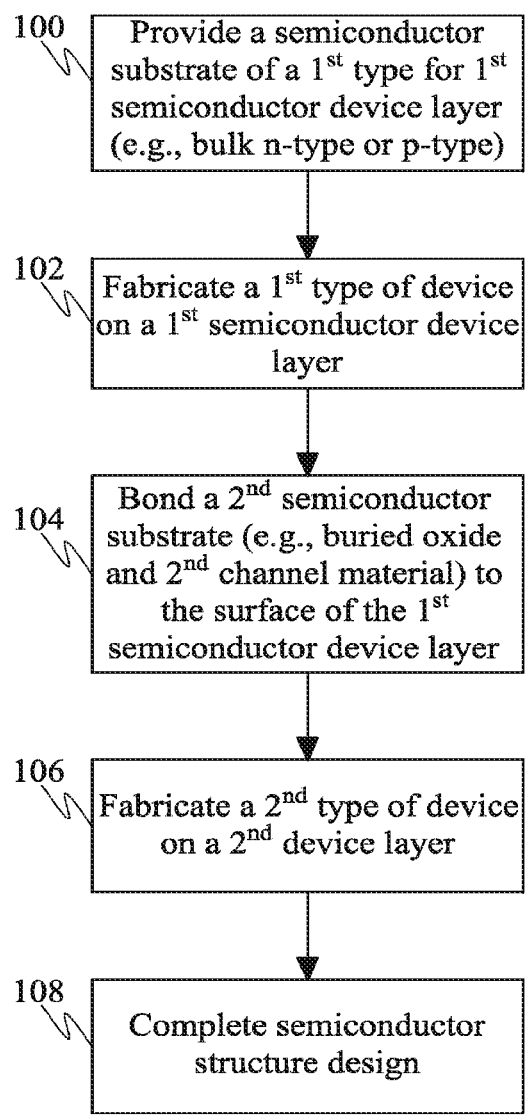
FIGS. 2-5 are process flow charts depicting example methods for generating a multilayer semiconductor device structure.

FIG. 2 is a process flow chart depicting an example method for creating a multi-layer semiconductor structure having two semiconductor device layers. A bulk semiconductor substrate is provided (operation 100) for the first layer. In some embodiments the bulk substrate can include an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonite; an alloy semiconductor including SiGe, GaAsP, AlInAs, AlGaAs, GaInAs, GaInP, and GaInAsP; any other suitable material; or combinations thereof. In some embodiments the bulk substrate can include p-type material and in other embodiments the bulk substrate can include n-type material. The substrate may include isolation regions, doped regions, and/or other features.

The first semiconductor device layer is fabricated on the bulk substrate (operation 102). The first semiconductor device layer can include devices of a first type or devices that perform a particular function. The first semiconductor layer may be fabricated using suitable processes including photolithography, etching, cleaning, chemical mechanical polishing/planarization ("CMP"), thin film deposition, thermal process (e.g., doping, activation/surface, passivation/material consolidation), epitaxy, and material filling, among others. For example, the photolithography process may include forming a photoresist layer (resist), exposing the resist to a pattern, performing post-exposure bake processes, and developing the resist to form a masking element. The masking element may then be used in an etching process. The etching may be performed using reactive ion etch ("RIE") and/or other suitable processes. The first semiconductor device layer is fabricated with a patterned top surface.

After the devices on the first semiconductor layer are fabricated, a second semiconductor substrate is provided and bonded to the patterned top surface of the first semiconductor device layer (operation 104). The second semiconductor substrate comprises a semiconductor on insulator ("SOI") substrate. The bottom surface of the insulator of the SOI substrate is bonding to the top surface of the first semiconductor layer using a layer of glue. In some embodiments, the bonding surface of the insulator and patterned surface of the first semiconductor layer are processed to clean, remove excess particles, and make the surfaces hydrophobic or hydrophilic. After the surfaces are processed, the wafer containing the first semiconductor layer and the wafer containing the SOI substrate are aligned. After alignment the layers can be bonded through a touch and press process. The Van der Waals force will link the atoms of the interface between the bottom of the second semiconductor layer and the top of the first semiconductor layer together (this process may involve some plasma enhancement technique). Also a thermal procedure can be applied to enhance the linking of atoms at the interface. The resultant semiconductor structure can have a planarization process or CMP process applied to reduce the thickness of second semiconductor layer to the required thickness (e.g., 5-20 nm, the channel thickness of the 2.sup.nd device).

After bonding, a second semiconductor device layer is fabricated on the second semiconductor substrate (operation 106). The second semiconductor layer may be fabricated using a number of using suitable processes including photolithography, etching, cleaning, chemical mechanical polishing/planarization ("CMP"), thin film deposition, thermal process, epitaxy, and material filling, among others.

The second semiconductor substrate has a semiconductor on insulator ("SOI") structure comprising a buried oxide and a second channel material. The buried oxide functions as an electrical insulator underneath the semiconductor channel material. The buried oxide may be formed from material such as SiO.sub.2, HfO, Al.sub.2O.sub.3 or other suitable oxide material. The electrical insulator functions to insulate the second channel material in the second semiconductor substrate from the devices formed on the first semiconductor device layer.

The second channel material may be formed from material such as Si, SiGe, GaAs, or others. The second channel material may be the same as or different from the semiconductor channel material used in the first semiconductor device layer. This can allow for selectively constructing certain semiconductor devices with the channel material of the first semiconductor substrate and other semiconductor devices with the channel material of the second semiconductor substrate. For example, the channel material of the first semiconductor substrate may be Ge and used for fabricating PMOS devices, and the channel material of the second semiconductor substrate may be GaAs and used for fabricating NMOS devices for boosting the performance of NMOS and PMPS transistors.

After fabricating the second semiconductor device layer, the semiconductor structure can be completed (operation 108). Completion comprises back end of line ("BEOL") operations where the individual devices are interconnected with wiring on the multi-layer semiconductor structure. BEOL may include fabrication of contacts, insulating layers (dielectrics), metal levels, and bonding sites for chip-to-package connections.

The method provided in FIG. 2 in some implementations can result in decreased device surface area usage. Single passive devices such as a diode, resistor, or capacitor or a bipolar junction transistor ("BJT") typically occupy a large footprint. By stacking the passive devices and BJTs in a separate layer from the main logic circuit, chip surface area can be reduced in some implementations.

Figure 3:
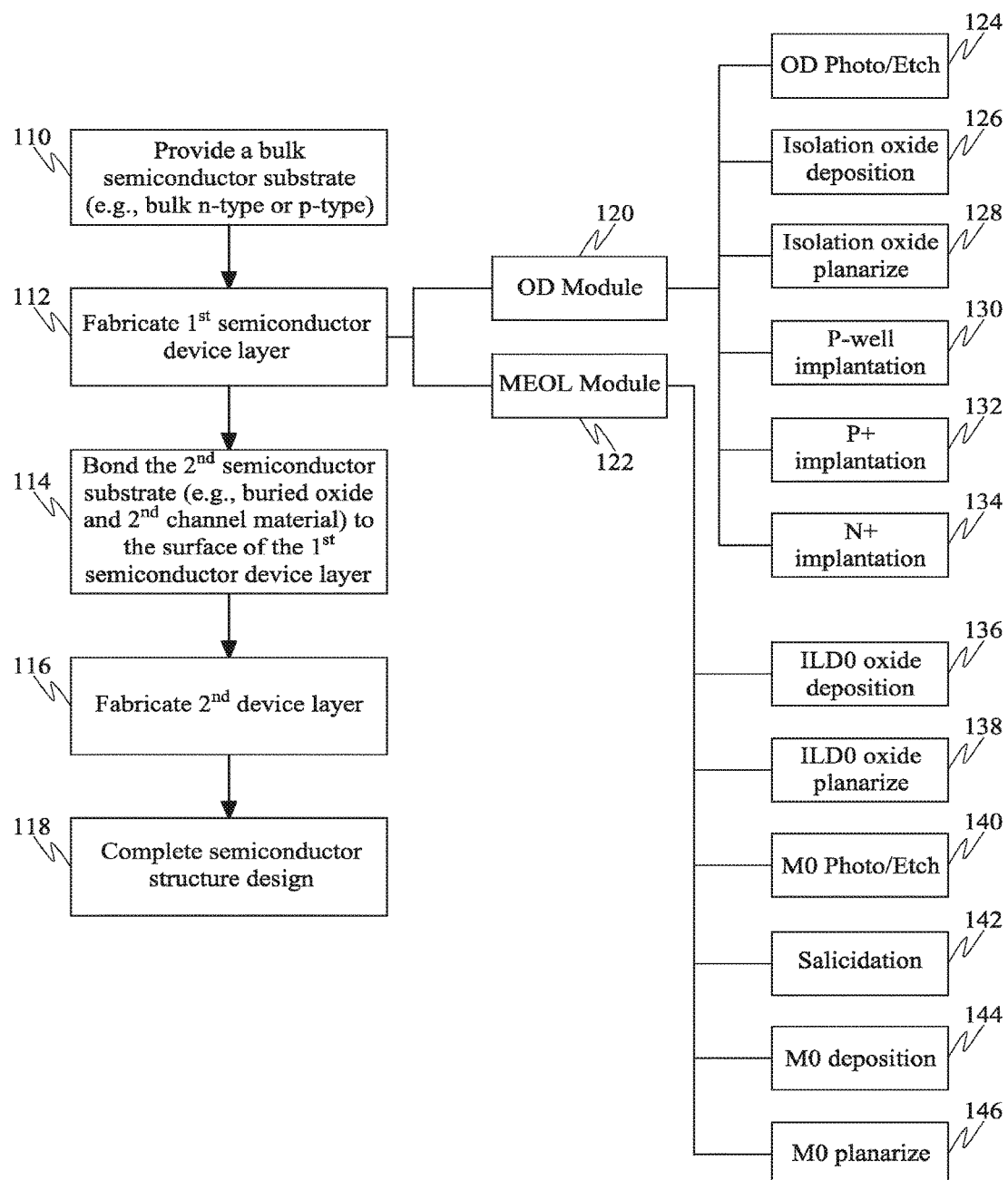

FIG. 3 is a process flow chart depicting another example method for creating a multi-layer semiconductor structure having two semiconductor device layers. In this example, the circuit of FIG. 1A is fabricated into a multilayer semiconductor structure. This example method involves providing a bulk substrate for a first semiconductor device layer (operation 110), fabricating the first semiconductor layer with a patterned top surface (operation 112), bonding the bottom insulator surface of a SOI substrate to the top patterned surface of the first semiconductor layer (operation 114), fabricating the second device layer on the SOI substrate (operation 116), and completing the semiconductor structure with wiring and metallization layers (operation 118). The example method of FIG. 3 is similar to the example method of FIG. 2, but provides specific examples regarding how the first semiconductor layer may be fabricated.

In particular, fabrication of devices in the first semiconductor device layer, in this example, involves an oxidation ("OD") module process (operation 120) and a middle end of line ("MEOL") module process (operation 122). The OD module process (operation 120) may involve a number of iterations of oxidation operations, photolithography operations, etching operations, and diffusion (ion implantation) operations. The MEOL module process (operation 122) may involve providing contacts, insulating layers (dielectrics), and metal layers to the fabricated devices.

More specifically, the OD module process (operation 120), as depicted in the example of FIG. 3, may involve photo-lithography and etching operations (operation 124), depositing isolation oxide (operation 126), isolation oxide planarizing (operation 128), P-well implantation (operation 130), P.sup.+ implantation (operation 132) and N.sup.+ implantation (operation 134). The MEOL module process, as depicted in the example of FIG. 3, may involve depositing interlayer dielectric oxide material ("ILD0") (operation 136), planarizing the ILD0 oxide (operation 138), preparing the metallization area by providing photo resist and etching (operation 140), salicidation (operation 142), depositing the metal material (operation 144), and planarizing the deposited metal material (operation 146).

The photolithography and etching operations (operation 124) may result in substrate material being removed from certain regions of the bulk substrate. The isolation oxide deposition (operation 126) and isolation oxide planarizing (operation 128) may result in isolation oxide being deposited within the regions vacated during the photo-lithography and etching operations (operation 124). The P-well implantation (operation 130) may result in a P-well implantation in the substrate material. The P.sup.+ implantation (operation 132) may result in P+ regions formed by dopants above the P-well region. The N.sup.+ implantation (operation 134) may result in N+ regions formed by dopants above the P-well region.

The interlayer dielectric oxide material ("ILD0") deposition (operation 136) and ILD0 oxide planarizing (operation 138) may result in a planar layer of interlayer dielectric oxide material being deposited over the first layer structure. Preparing the metallization area by providing photo resist and etching (operation 140) may result in the dielectric material being removed from above the N+ region and one of the P+ regions. The salicidation (operation 142), depositing the metal material (operation 144), and planarizing the deposited metal material (operation 146) may result in metal contact material, such as W or Cu, being applied above the N+ region and one of the P+ regions thereby providing a patterned surface comprising gate material and interlayer dielectric material. The first device layer is complete at this point.

Figure 4:
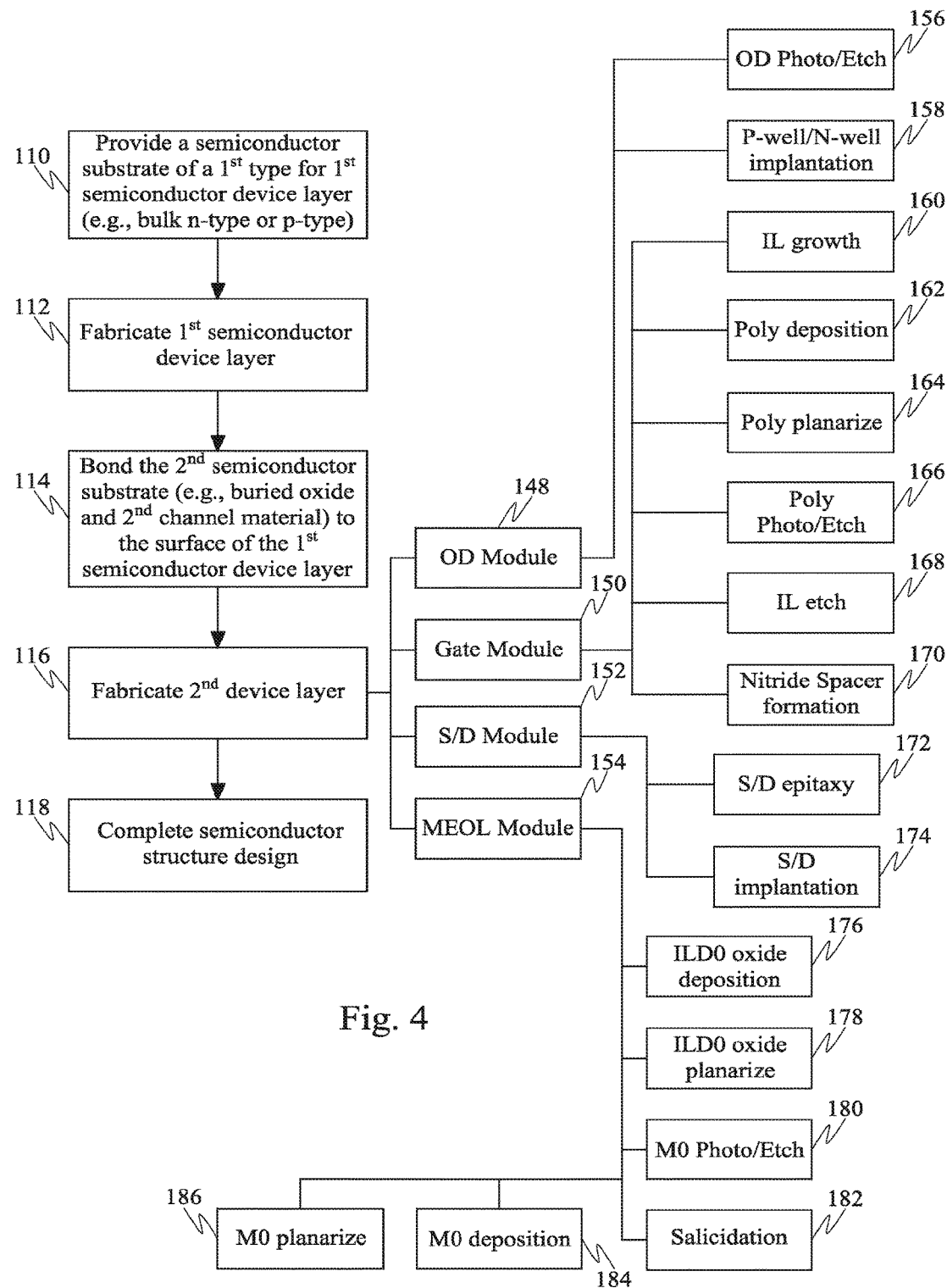

FIG. 4 is a process flow chart depicting another example method for creating a multi-layer semiconductor structure having two semiconductor device layers. This example method also involves providing a bulk substrate for a first semiconductor device layer (operation 110), fabricating the first semiconductor layer (operation 112), bonding the bottom insulator surface of a SOI substrate to the top patterned surface of the first semiconductor layer (operation 114), fabricating the second device layer on the SOI substrate (operation 116), and completing the semiconductor structure with wiring and metallization layers (operation 118). The example method of FIG. 4 is similar to the example methods of FIGS. 2 and 3, but provides specific examples regarding how the second semiconductor layer may be fabricated. This example method can be used to fabricate the logic circuit depicted in FIG. 1A using FinFET technology.

In particular, fabrication of devices in the second semiconductor device layer, in this example, involves an oxidation ("OD") module process (operation 148), a gate module process (operation 150), a source/drain module process (operation 152), and a middle end of line ("MEOL") module process (operation 154).

The OD module process (operation 148), as depicted in the example of FIG. 4, may involve photolithography and etching operations (operation 156) to form OD fins for the NMOS transistor and PMOS transistor of the inverter to be fabricated. The OD module process (operation 148) may also involve P-well and N-well implantation (operation 158) to implant the OD fins of the NMOS transistor with impurities to form P-wells and the OD fins of the PMOS transistor with impurities to form N-wells.

The gate module process (operation 150), as depicted in the example of FIG. 4, may involve dielectric material (IL) growth operations (operation 160), gate material deposition (operation 162), gate material planarizing (operation 164), gate material photo/etch operations (operation 166), and dielectric material etch operations (operation 168) to form a gate dielectric and the gate. The gate module process (operation 150) may also involve nitride spacer formation (operation 170).

The source/drain module process (operation 152), as depicted in the example of FIG. 4, may involve source/drain epitaxy (operation 172) with n-type epitaxial growth material in the source/drain region of the fins of the NMOS transistor and p-type epitaxial growth material in the source/drain region of the fins of the PMOS transistor. The source/drain module process (operation 152) may also involve source/drain implantation (operation 174) with N+ dopants implanted in the source/drain region of the fins of the NMOS transistor and P+ dopants implanted in the source/drain region of the fins of the PMOS transistor.

The middle end of line ("MEOL") module process (operation 154), as depicted in the example of FIG. 4, may involve depositing interlayer dielectric oxide material ("ILD0") (operation 176), planarizing the ILD0 oxide (operation 178), preparing the metallization area by providing photo resist and etching (operation 180), salicidation (operation 182), depositing the metal material (operation 184), and planarizing the deposited metal material (operation 186).

The interlayer dielectric oxide material ("ILD0") deposition (operation 176) and ILD0 oxide planarizing (operation 178) may result in a planar layer of interlayer dielectric oxide material over the source/drain regions of the NMOS and PMOS transistors and level with the gate region and nitride spacers. Preparing the metallization area by providing photo resist and etching (operation 180) may result in the dielectric material being removed above the source/drain regions of the NMOS and PMOS transistors. The salicidation (operation 182), metal material deposition (operation 184), and deposited metal material planarizing (operation 186) may result in metal contact material being applied above the source/drain regions of the NMOS and PMOS transistors and level with the gate region and nitride spacers.

Figure 5:
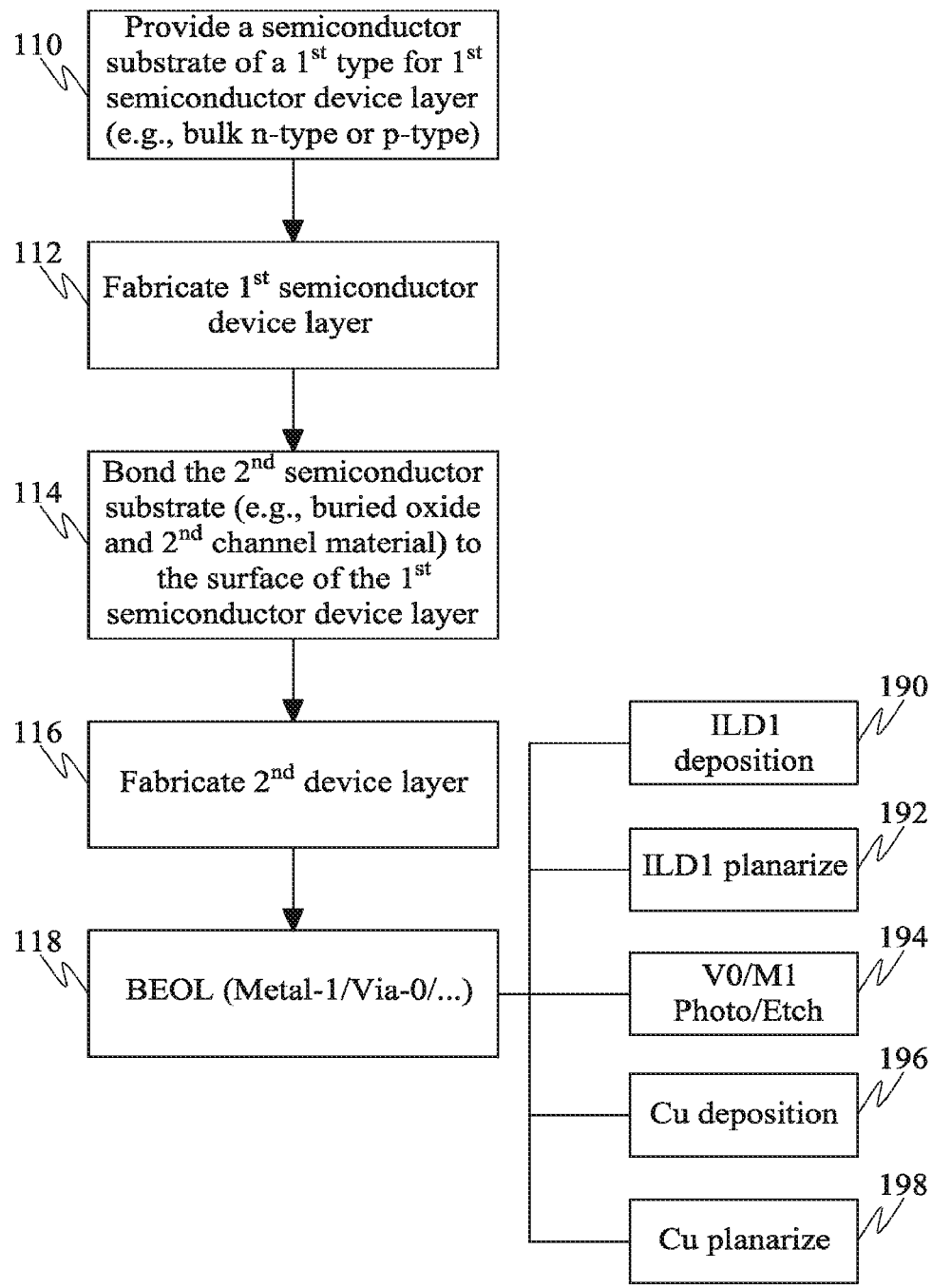

FIG. 5 is a process flow chart depicting another example method for creating a multi-layer semiconductor structure having two semiconductor device layers. This example method also involves providing a bulk substrate for a first semiconductor device layer (operation 110), fabricating the first semiconductor layer (operation 112), bonding the bottom insulator surface of a SOI substrate to the top patterned surface of the first semiconductor layer (operation 114), fabricating the second device layer on the SOI substrate (operation 116), and completing the semiconductor structure with BEOL processing (operation 188). The example method of FIG. 5 is similar to the example method of FIGS. 2, 3 and 4, but provides specific examples regarding how BEOL processing may be performed.

The BEOL process (operation 188), as depicted in the example of FIG. 5, may involve depositing interlayer dielectric oxide material ("ILD1") (operation 190), planarizing the ILD1 oxide (operation 192), preparing the metallization area by providing photo resist and etching (operation 194), depositing the metal material (operation 196), and planarizing the deposited metal material (operation 198).

The interlayer dielectric oxide material ("ILD1") deposition (operation 190) and ILD1 oxide planarizing (operation 192) may result in a planar layer of interlayer dielectric oxide material over the second semiconductor device layer. Preparing the metallization area by providing photo resist and etching (operation 194) may result in the dielectric material being removed from above regions of the multi-layer semiconductor device structure needing the VSS, VDD, Input, and Output connections. The metal material deposition (operation 196), and deposited metal material planarizing (operation 198) may result in metal contact material being applied to the VSS, VDD, Input, and Output connection regions.

Although the example methods depicted in FIGS. 2-5 provide operations for fabricating a multilevel semiconductor device structure having two semiconductor device layers, the methods may be modified to allow for more than two semiconductor device layers. If a third or more semiconductor device layer is desired, a SOI substrate can be bonded to the top surface of the preceding semiconductor device layer and a new device layer fabricated thereon. Operations such as those depicted in FIG. 4 may be used for the third or more semiconductor device layer. The BEOL operations may be performed after the third or more device layers are fabricated.

Figure 6A:
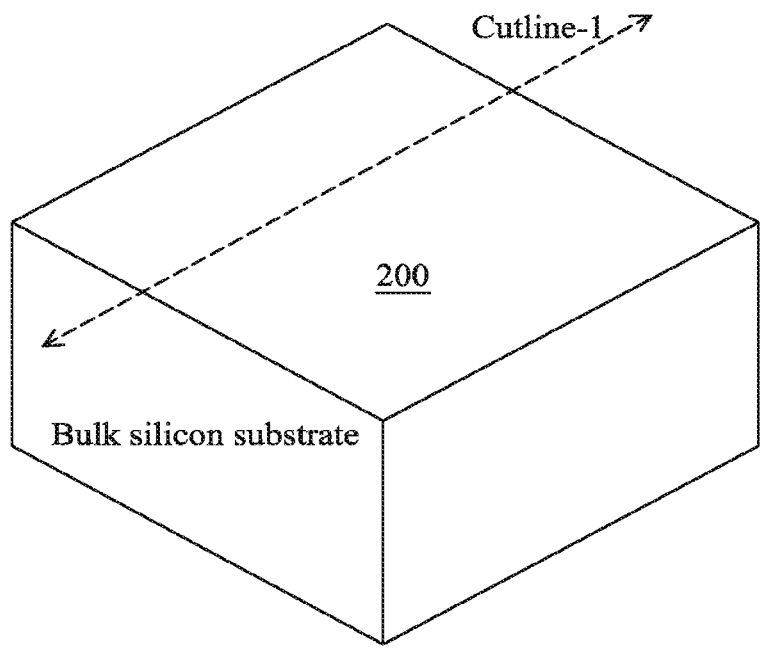
FIGS. 6A, 6B, 7A, 7B, 8A, 8B, 9A, 9B, 9C, 10A, 10B, 11A, 11B, 12A, 12B, 12C, 13A, 13B, 14A, 14B, 15A, 15B, 16A, 16B, 16C, 17A, 17B, 17C, 18A, 18B, 18C, 19A, 19B, 19C, 20A, 20B, 20C, 21A, 21B, 21C, 22A, 22B, 22C, 23A, 23B, 23C and 24 are drawings depicting example states of a semiconductor structure during fabrication of multilayer semiconductor structure.
Figure 6B:
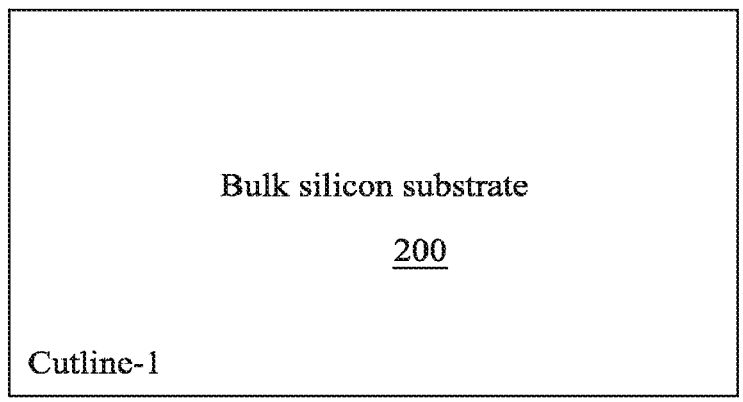

FIG. 6A depicts an isometric view of an example portion of a bulk silicon substrate 200 that may be provided for use with any of the methods described in FIGS. 3-5 to fabricate the circuit of FIG. 1A into a multi-layer semiconductor structure. FIG. 6B provides a cross-sectional view of the bulk silicon substrate 200 from cutline 1 of FIG. 6A.

Figure 7A:
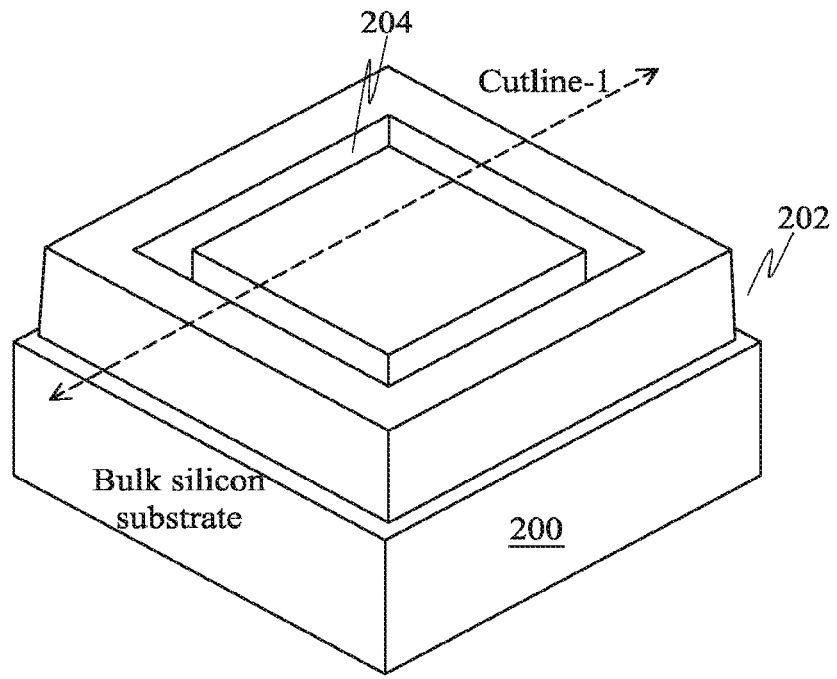
Figure 7B:
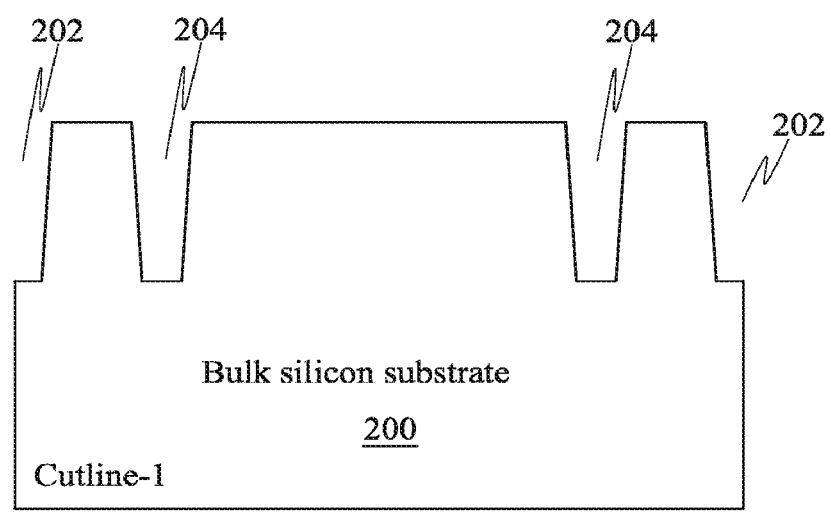

FIGS. 7A-9C depict example intermediary states of the multi-layer semiconductor structure during performance of the OD Module operations depicted in FIG. 3. In particular, FIG. 7A depicts an isometric view of a portion of the silicon substrate 200 after photo-lithography and etching operations (operation 124 of FIG. 3) have been performed. FIG. 7B provides a cross-sectional view of the substrate 200 from cutline 1 of FIG. 7A. FIGS. 7A-7B show regions 202, 204 where substrate material has been etched away from the substrate 200.

Figure 8A:
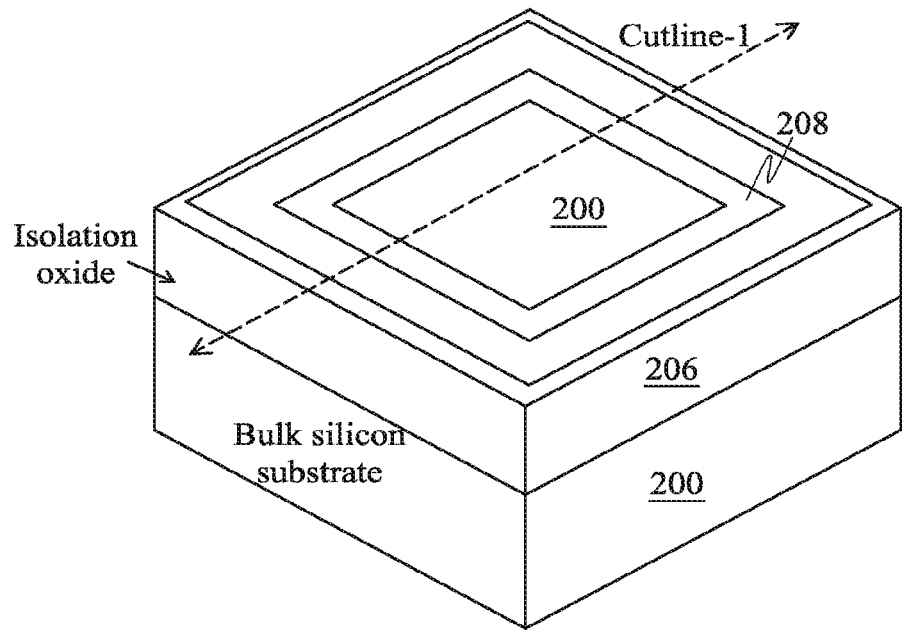
Figure 8B:
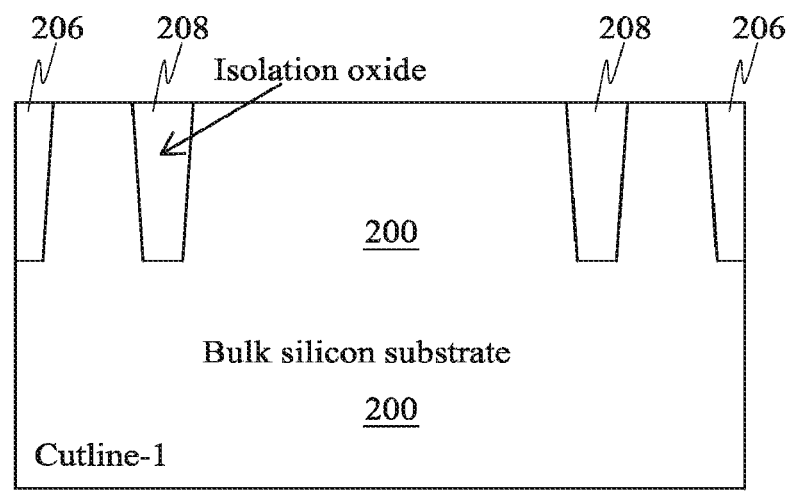

FIG. 8A depicts an isometric view of a portion of the silicon substrate 200 after isolation oxide deposition (operation 126 of FIG. 3) and isolation oxide planarizing (operation 128 of FIG. 3) have been performed. FIG. 8B provides a cross-sectional view of the substrate 200 from cutline 1 of FIG. 8A. FIGS. 8A-8B illustrate that isolation oxide 206, 208 may be deposited within the regions etched away during the photo-lithography and etching operations (operation 124 of FIG. 3).

Figure 9A:
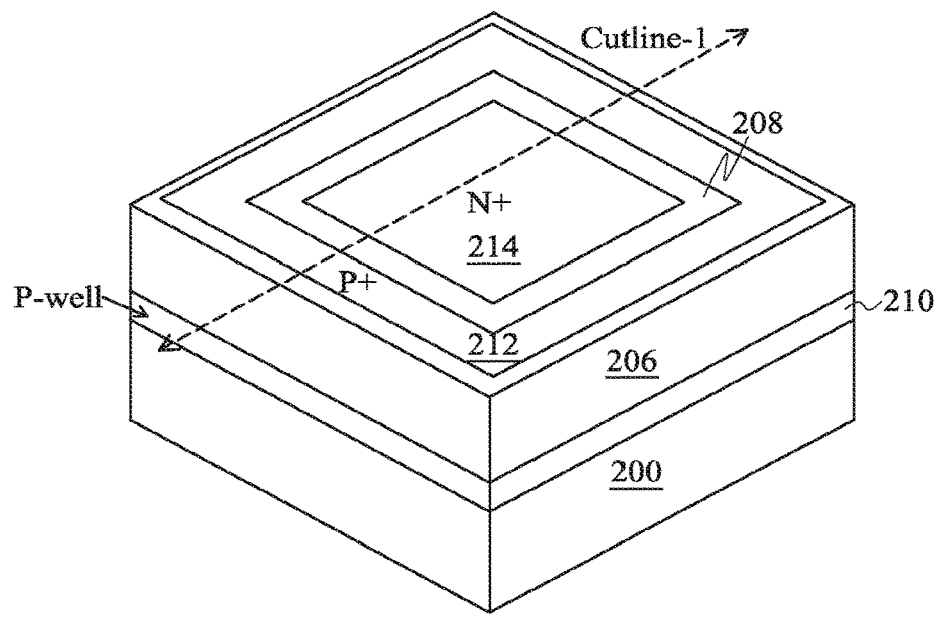
Figure 9B:
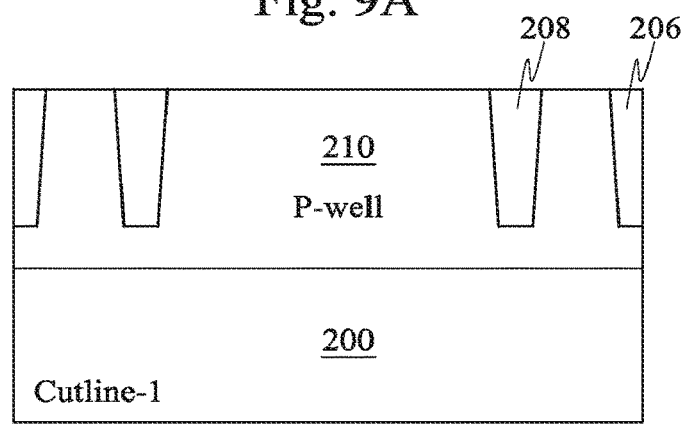
Figure 9C:
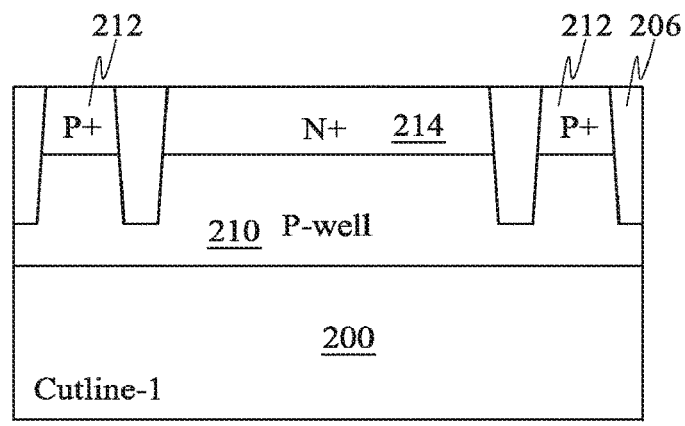

FIG. 9A depicts an isometric view of a portion of the silicon substrate 200 after P-well implantation (operation 130 of FIG. 3), P+ implantation (operation 132 of FIG. 3), and N+ implantation (operation 134 of FIG. 3). FIG. 9B provides a cross-sectional view of the substrate 200 from cutline 1 of FIG. 9A after P-well implantation but before P+ and N+ implantation. FIG. 9B illustrates that the implanted P-well 210 may have a depth of .about.200-300 nm in the substrate material 200. FIG. 9C provides a cross-sectional view of the substrate 200 from cutline 1 of FIG. 9A after P+ and N+ implantation. FIG. 9C illustrates that the implanted P+ region 212 and N+ region 214 may have a depth of .about.30-60 nm in the substrate material 200.

Figure 10A:
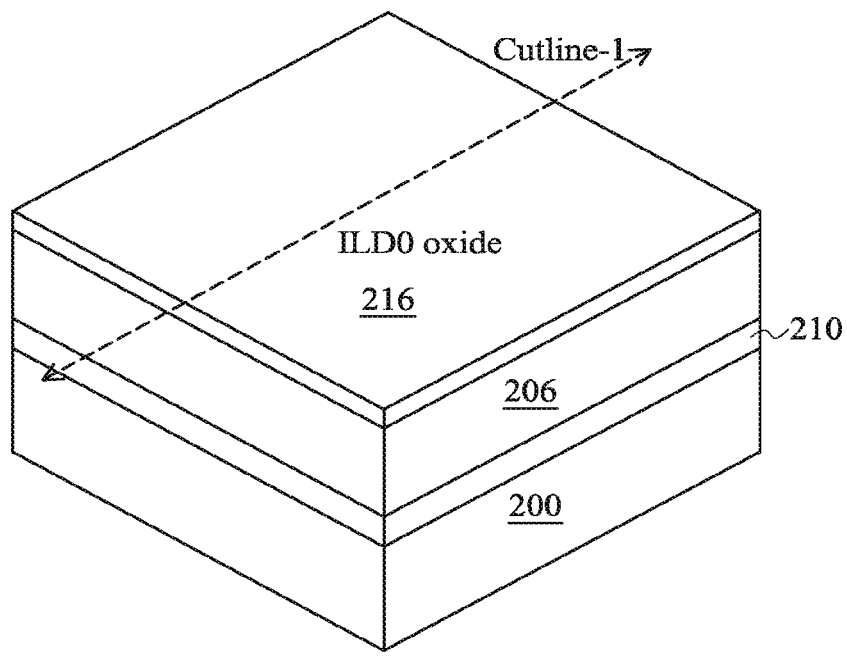
Figure 10B:
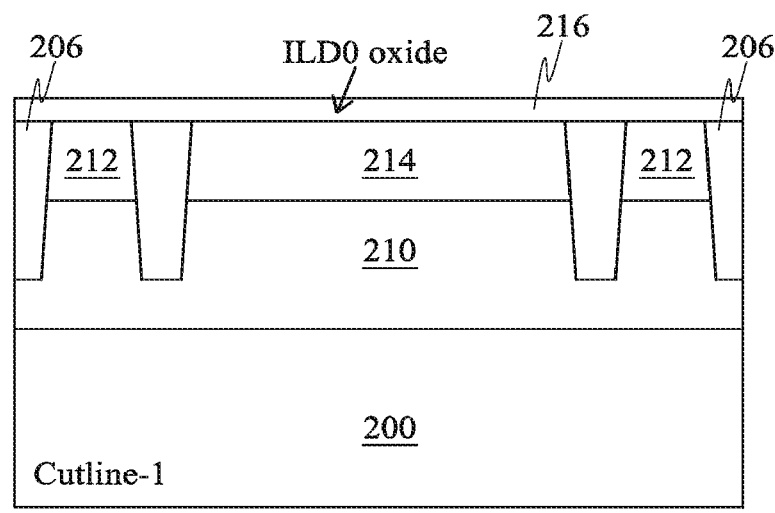

FIGS. 10A-12C depict example intermediary states of the multi-layer semiconductor structure during performance of the MEOL Module operations depicted in FIG. 3. In particular, FIG. 10A depicts an isometric view of a portion of the silicon substrate after interlayer dielectric oxide material ("ILD0") deposition (operation 136 of FIG. 3) and the ILD0 oxide planarizing (operation 138 of FIG. 3). FIG. 10B provides a cross-sectional view of the substrate from cutline 1 of FIG. 10A. FIGS. 10A-10B illustrate a planar layer 216 of interlayer dielectric oxide material applied over the fabricated material.

Figure 11A:
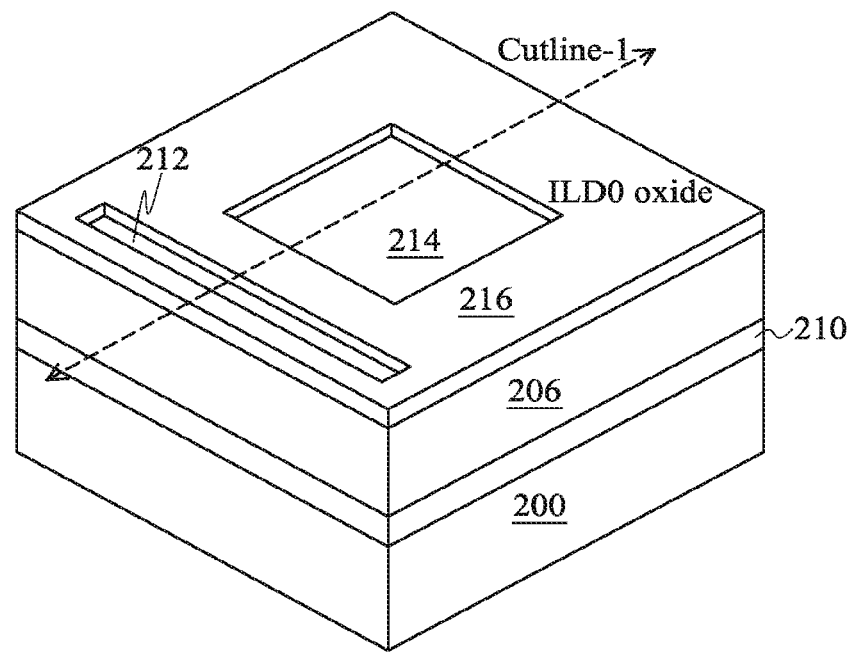
Figure 11B:
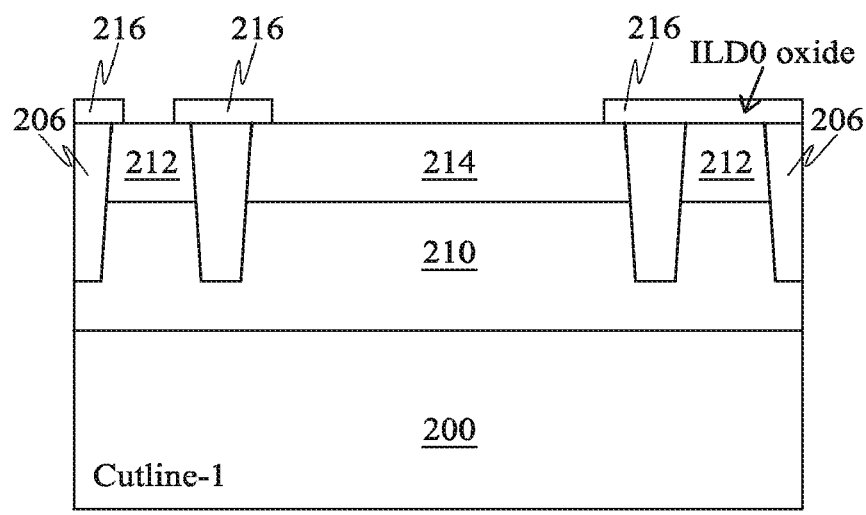

FIG. 11A depicts an isometric view of a portion of the silicon substrate after performing photo resist and etching operations around the metallization area (operation 140 of FIG. 3). FIG. 11B provides a cross-sectional view of the substrate from cutline 1 of FIG. 11A. FIGS. 11A-11B illustrate that the dielectric oxide material 216 has been removed above the N+ region 214 and a portion of the P+ region 212.

Figure 12A:
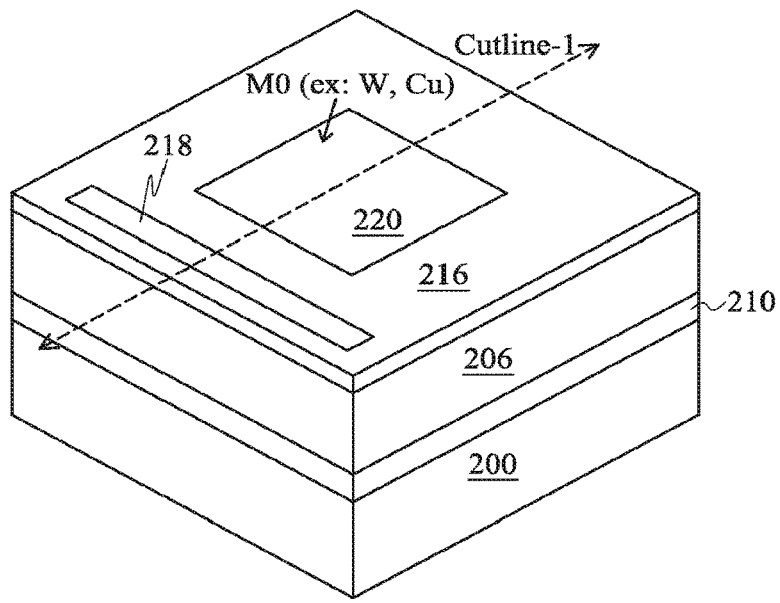
Figure 12B:
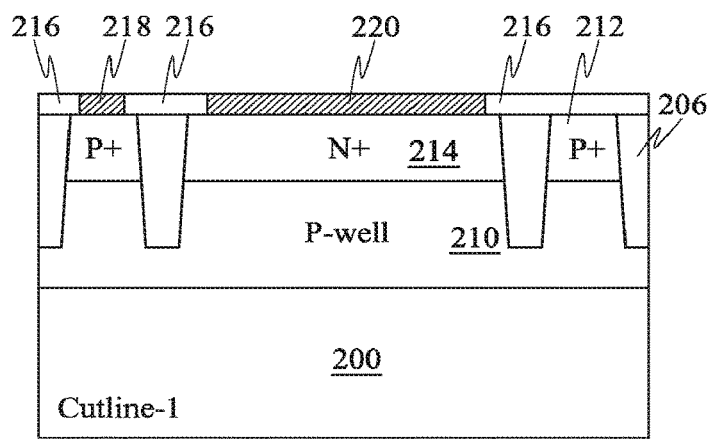
Figure 12C:
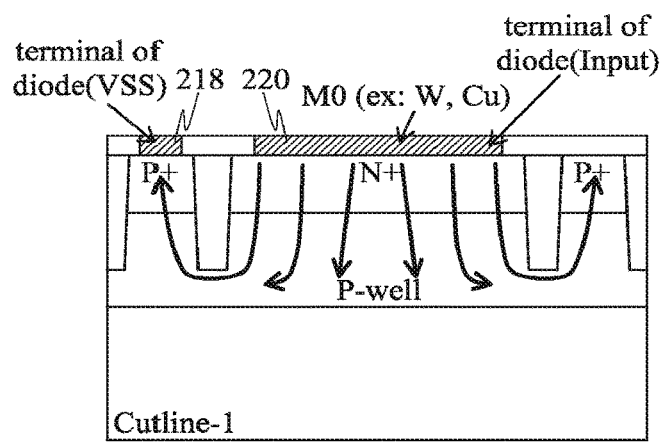

FIG. 12A depicts an isometric view of a completed first layer diode device after salicidation (operation 142 of FIG. 3), metal deposition (operation 144 of FIG. 3), and metal planarizing (operation 146 of FIG. 3) have been performed. FIGS. 12B and 12C provide a cross-sectional view of the first layer from cutline 1 of FIG. 12A. FIGS. 12A-12B illustrate the formation of a VSS diode terminal 218 and input diode terminal 220 from the metal material. The metal material used may include W, Cu or others. FIG. 12C illustrates the current path for the diode formed. When the device is operational, current flow is perpendicular to the N+/P-well junction surface (i.e., in the vertical direction) since the diode is a vertical device.

Figure 13A:
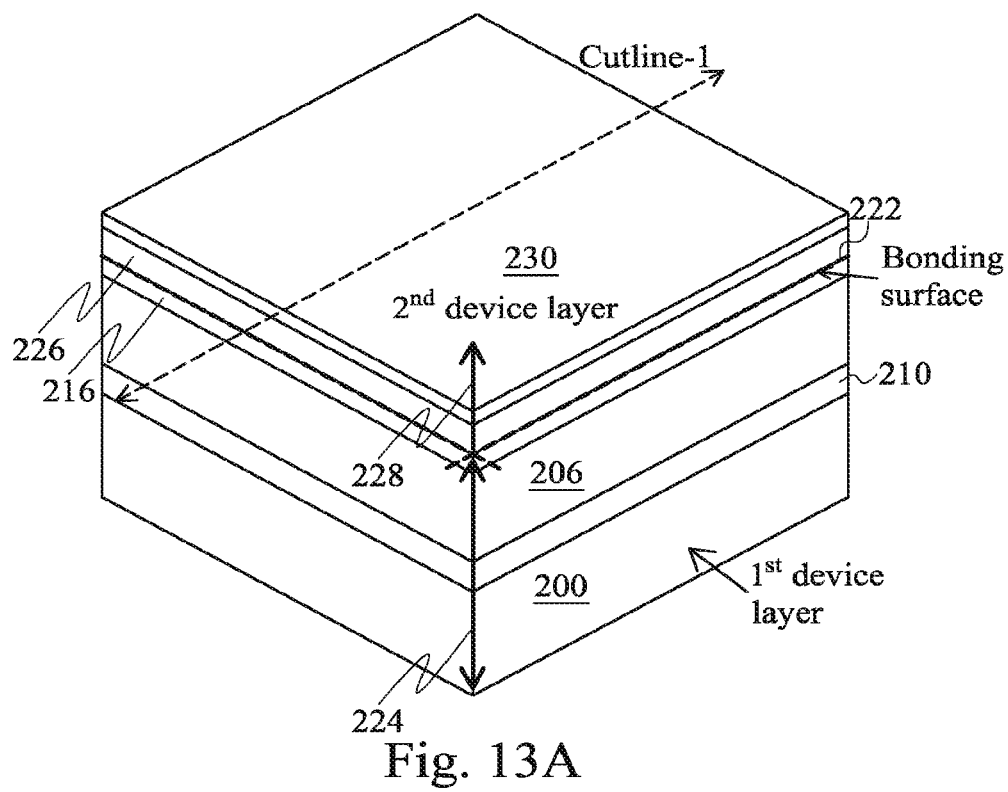
Figure 13B:
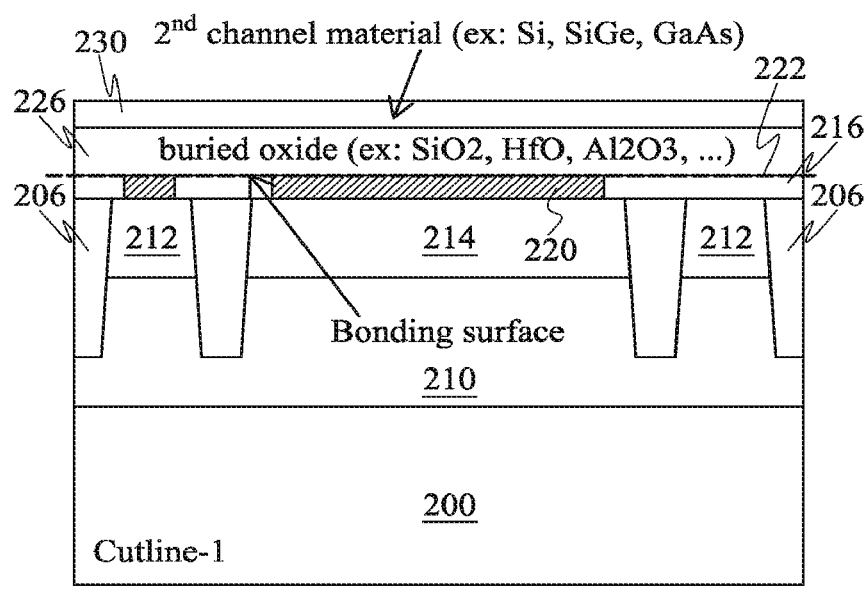

FIGS. 13A-21C depict example intermediary states of the multi-layer semiconductor structure during fabrication of the second semiconductor device layer during performance of the operations depicted in FIG. 4. In particular, FIG. 13A depicts an isometric view of a portion of the multi-layer semiconductor structure after bonding the buried oxide 226 of the second semiconductor device layer to the top patterned surface of the first semiconductor device layer (operation 114 of FIG. 4). FIG. 13B provides a cross-sectional view of the multi-layer semiconductor structure from cutline 1 of FIG. 13A. FIGS. 13A-13B illustrate a bonding surface 222 on the top patterned surface of the first device layer 224 and under the buried oxide 226 of the second device layer 228. Also, illustrated is the second channel material 230 above the buried oxide 226. The buried oxide 226 can be made of material such as SiO.sub.2, HfO, and Al.sub.2O.sub.3. The second channel material 230 can be made of material such as Si, SiGe, and GaAs.

Figure 14A:
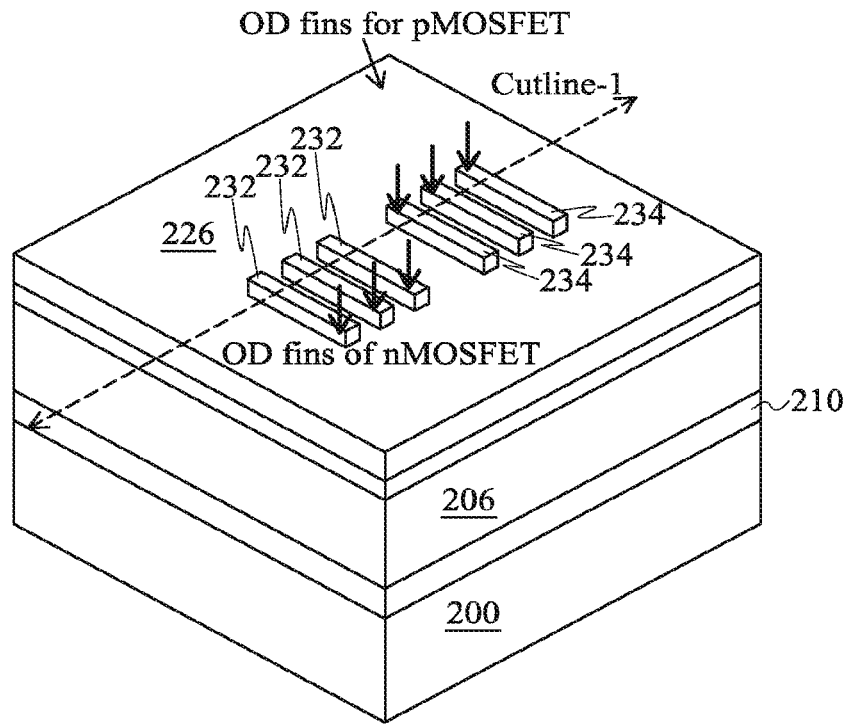
Figure 14B:
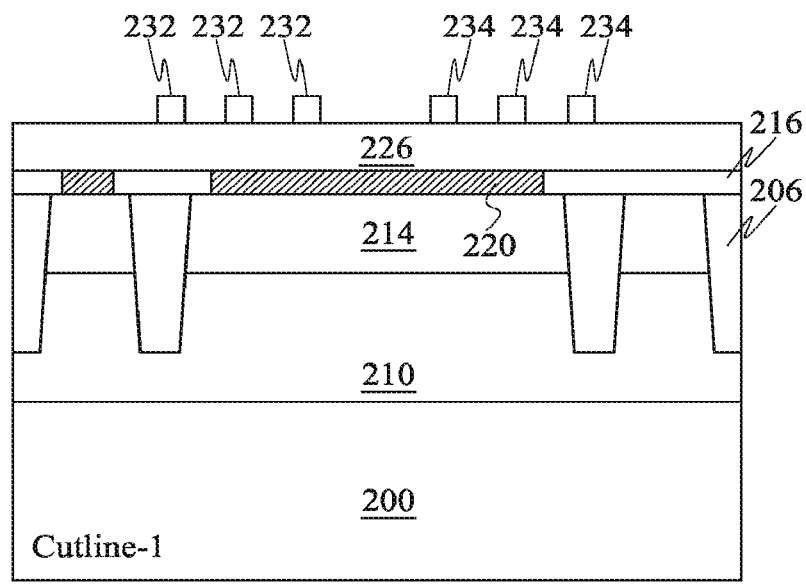

FIG. 14A depicts an isometric view of a portion of the multi-layer semiconductor structure after OD fins 232 for the NMOS transistor and OD fins 234 for the PMOS transistor have been formed by photolithography and etching operations (operation 156 of FIG. 4). FIG. 14B provides a cross-sectional view of the multi-layer semiconductor structure from cutline 1 of FIG. 14A and provides a cross-sectional view of the OD fins 232 for the NMOS transistor and OD fins 234 for the PMOS transistor.

Figure 15A:
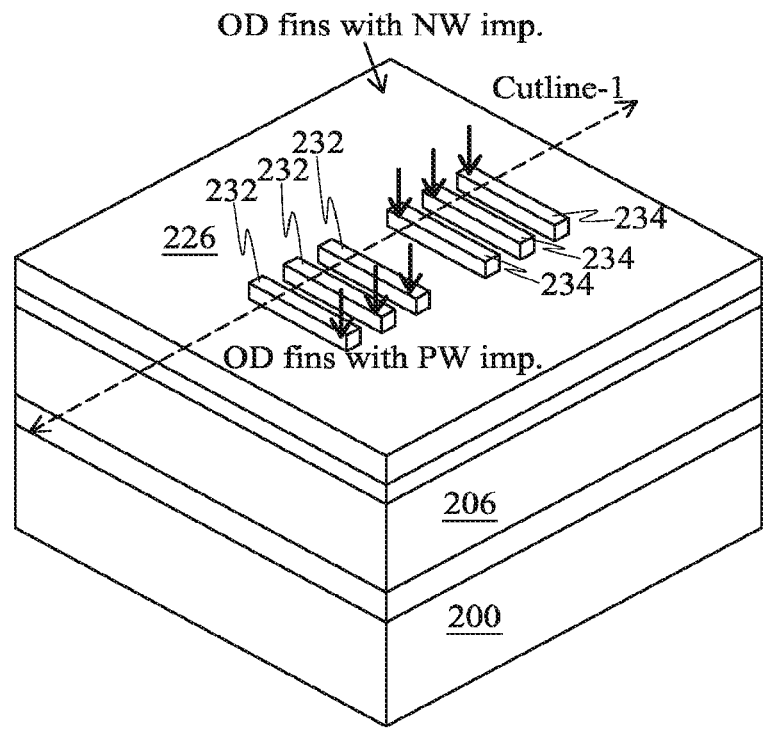
Figure 15B:
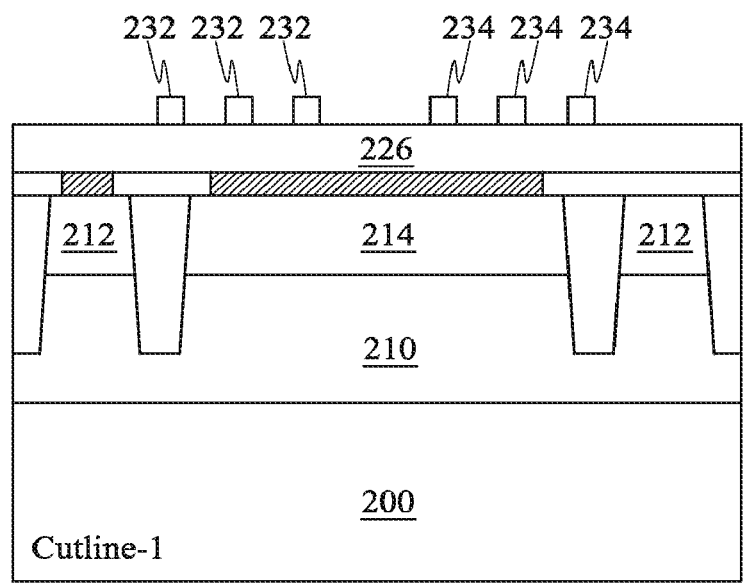

FIG. 15A depicts an isometric view of a portion of the multi-layer semiconductor structure after P-well implantation in the OD fins 232 for the NMOS transistor and N-well implantation in the OD fins 234 for the PMOS transistor (operation 158 of FIG. 4). FIG. 15B provides a cross-sectional view of the multi-layer semiconductor structure from cutline 1 of FIG. 14A and provides a cross-sectional view of the OD fins 232 for the NMOS transistor and OD fins 234 for the PMOS transistor after P-well implantation and N-well implantation, respectively.

Figure 16A:
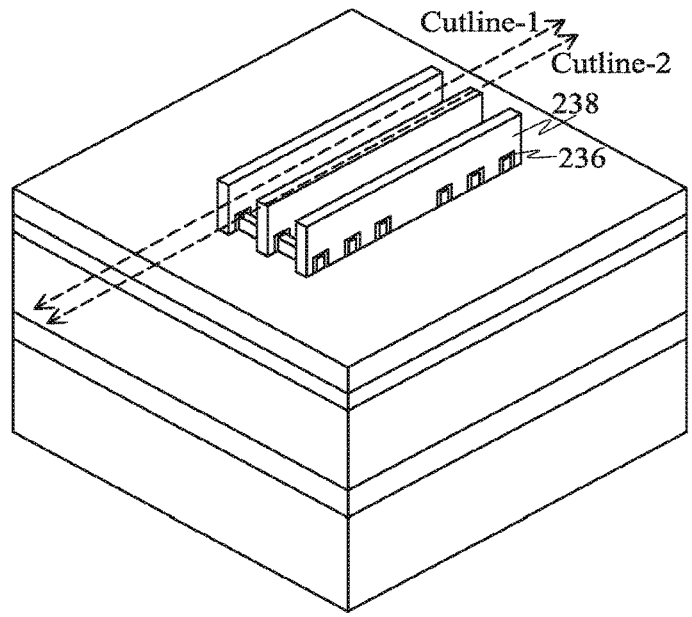
Figure 16B:
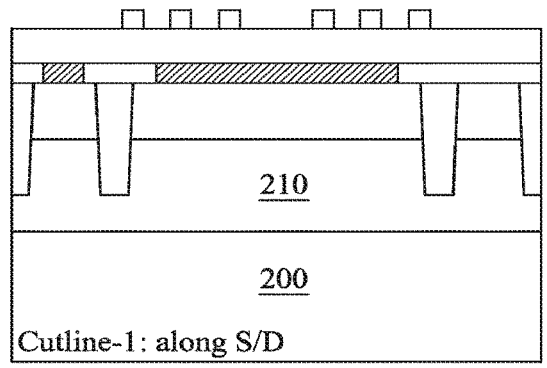
Figure 16C:
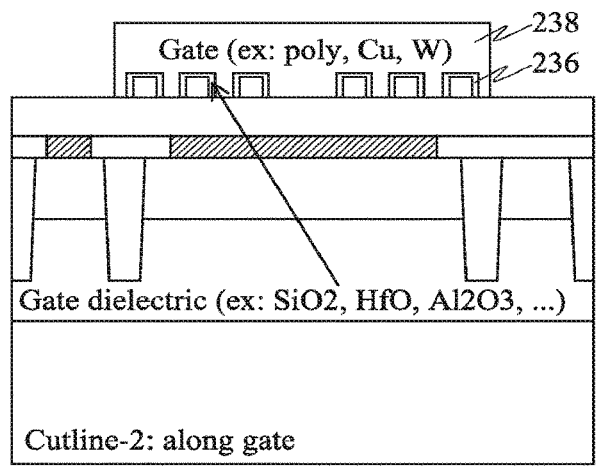

FIG. 16A depicts an isometric view of a portion of the multi-layer semiconductor structure during gate formation for the NMOS and PMOS FinFET devices after dielectric material (IL) growth operations (operation 160 of FIG. 4), gate material deposition (operation 162 of FIG. 4), gate material planarizing (operation 164 of FIG. 4), gate material photo/etch operations (operation 166 of FIG. 4), and dielectric material etch operations (operation 168 of FIG. 4) to form a gate dielectric 236 surrounding the fins 232, 234 in the gate region. The gate dielectric 236 can be made of materials such as $SiO_2$, HfO, and $Al_2O_3$, among others. The gate 238 is also illustrated and can be made of materials such as poly, Cu, and W. FIG. 16B provides a cross-sectional view of the multi-layer semiconductor structure from cutline 1 of FIG. 16A, and FIG. 16C provides a cross-sectional view of the multi-layer semiconductor structure from cutline 2 of FIG. 16A. FIG. 16C provides a cross-sectional view of the fins 232, 234 at the formed gate region 238 whereas FIG. 16B provides a cross-sectional view of the fins 232, 234 at a non-gate region.

Figure 17A:
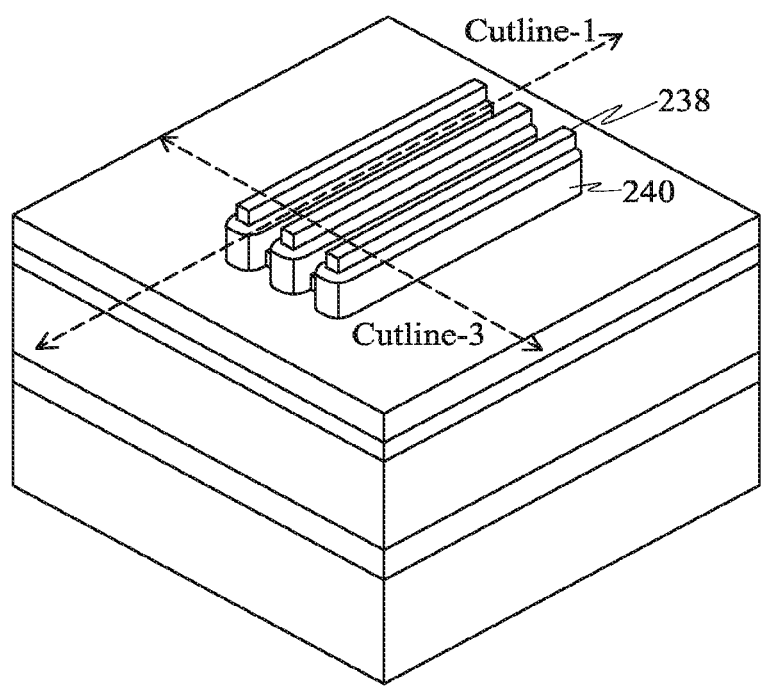
Figure 17B:
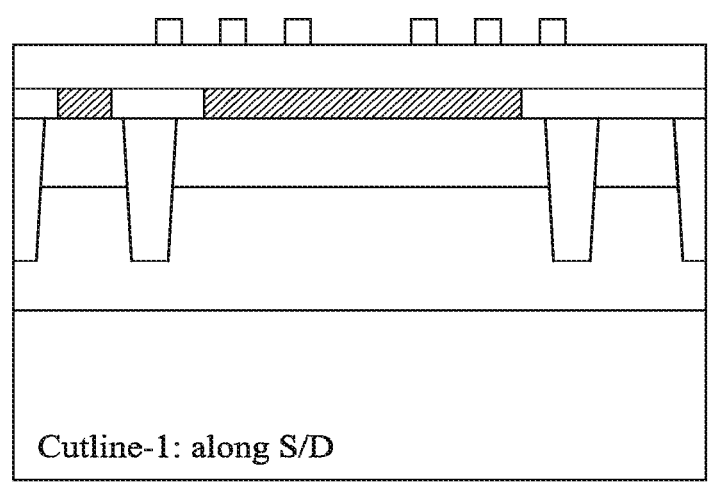
Figure 17C:
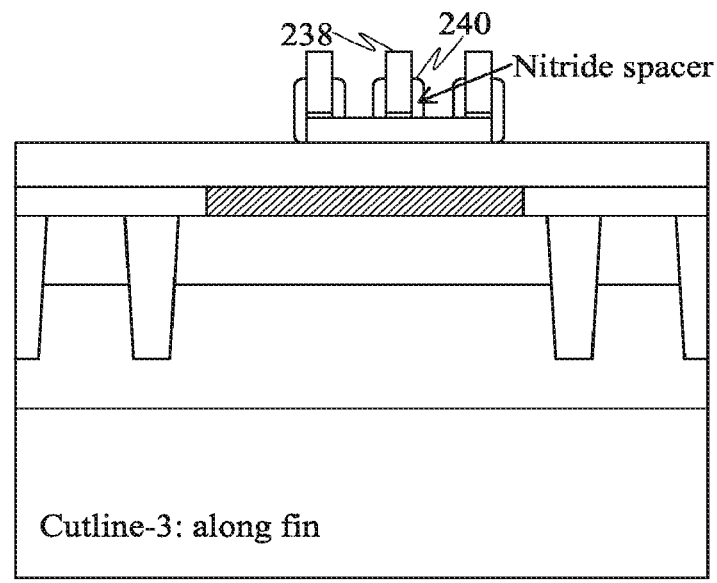

FIG. 17A depicts an isometric view of a portion of the multi-layer semiconductor structure during gate formation after nitride spacer formation (operation 170 of FIG. 4). FIG. 17B provides a cross-sectional view of the multi-layer semiconductor structure from cutline 1 of FIG. 17A, and FIG. 17C provides a cross-sectional view of the multi-layer semiconductor structure from cutline 3 of FIG. 17A. FIG. 17C provides a cross-sectional view along a fin whereas FIG. 17B provides a cross-sectional view between gate regions. FIGS. 17A and 17C illustrate nitride spacer formation.

Figure 18A:
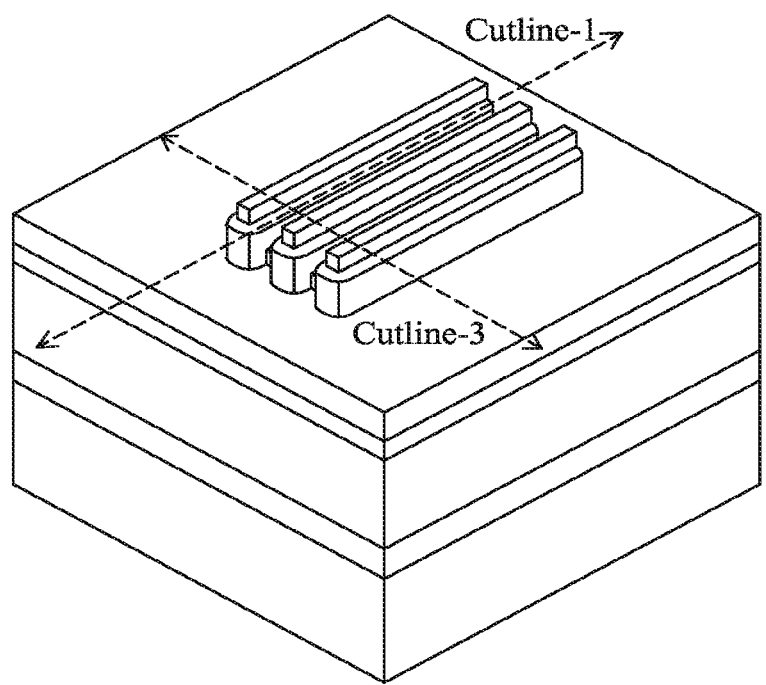
Figure 18B:
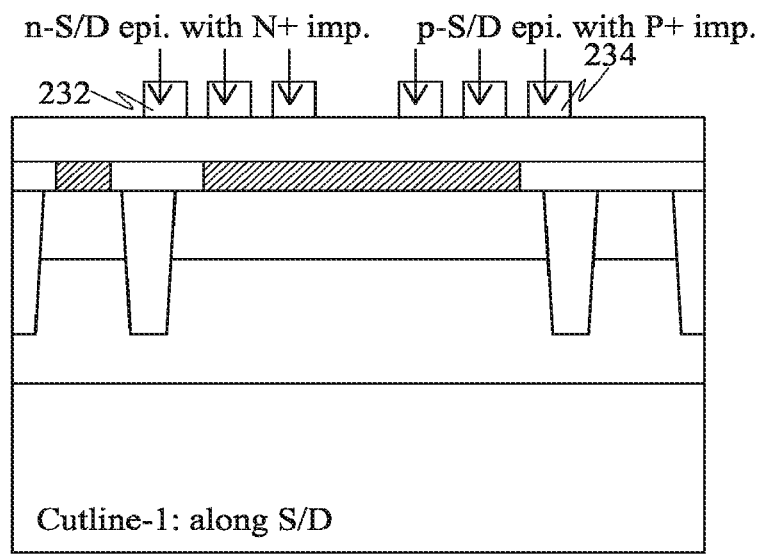
Figure 18C:
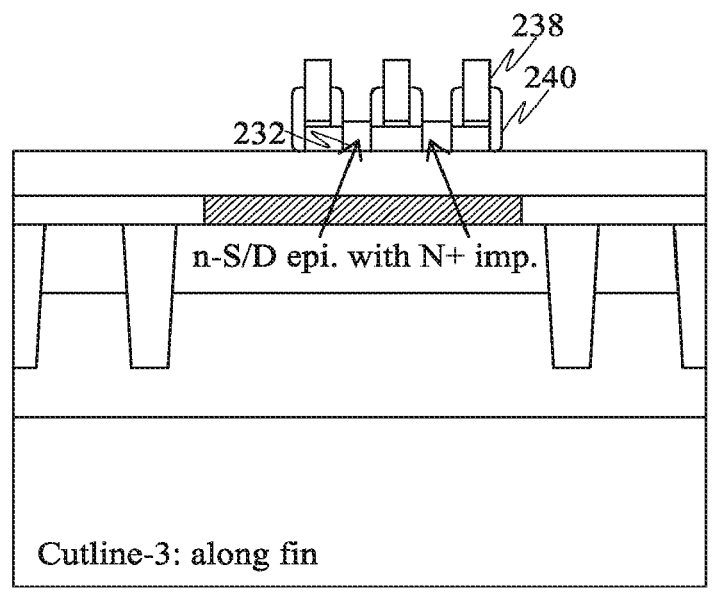

FIG. 18A depicts an isometric view of a portion of the multi-layer semiconductor structure after source/drain epitaxy (operation 172 of FIG. 4) and source/drain implantation (operation 174 of FIG. 4). FIG. 18B provides a cross-sectional view of the multi-layer semiconductor structure from cutline 1 of FIG. 18A, and FIG. 18C provides a cross-sectional view of the multi-layer semiconductor structure from cutline 3 of FIG. 18A. FIG. 18C provides a cross-sectional view along a fin whereas FIG. 18B provides a cross-sectional view between gate regions. FIGS. 18A-18C illustrate source/drain implantation with N+ dopants implanted in the source/drain region of the fins of the NMOS transistor and P+ dopants implanted in the source/drain region of the fins of the PMOS transistor.

Figure 19A:
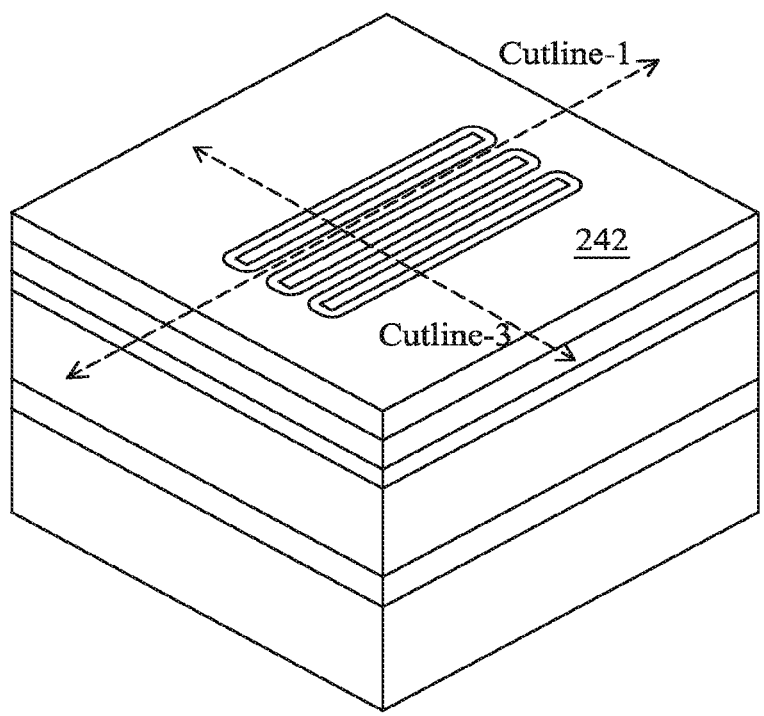
Figure 19B:
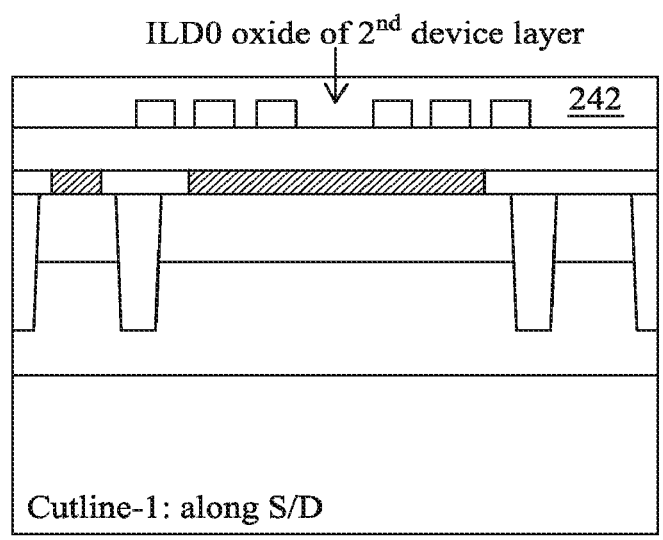
Figure 19C:
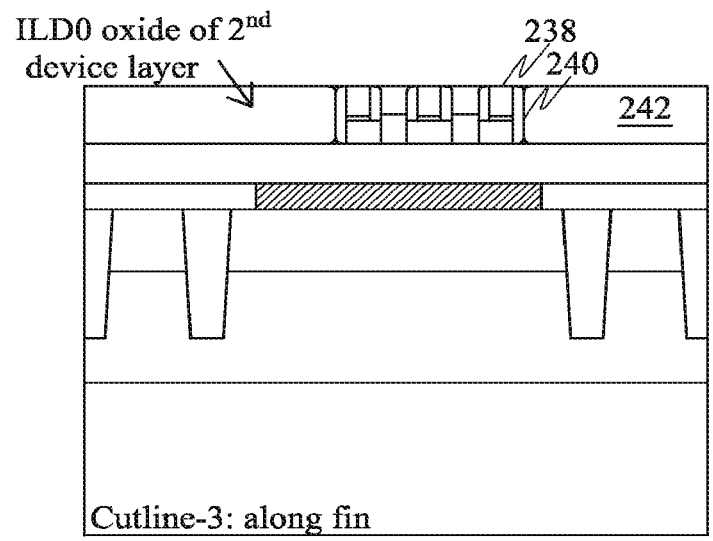

FIG. 19A depicts an isometric view of a portion of the silicon substrate after interlayer dielectric oxide material ("ILD0") deposition (operation 176 of FIG. 4) and the ILD0 oxide planarizing (operation 178 of FIG. 4). FIG. 19B provides a cross-sectional view of the multi-layer semiconductor structure from cutline 1 of FIG. 19A, and FIG. 19C provides a cross-sectional view of the multi-layer semiconductor structure from cutline 3 of FIG. 19A. FIGS. 19A-19C illustrate a planar layer 242 of interlayer dielectric oxide material over the source/drain regions of the NMOS and PMOS transistors and level with the gate region 238 and nitride spacers 240.

Figure 20A:
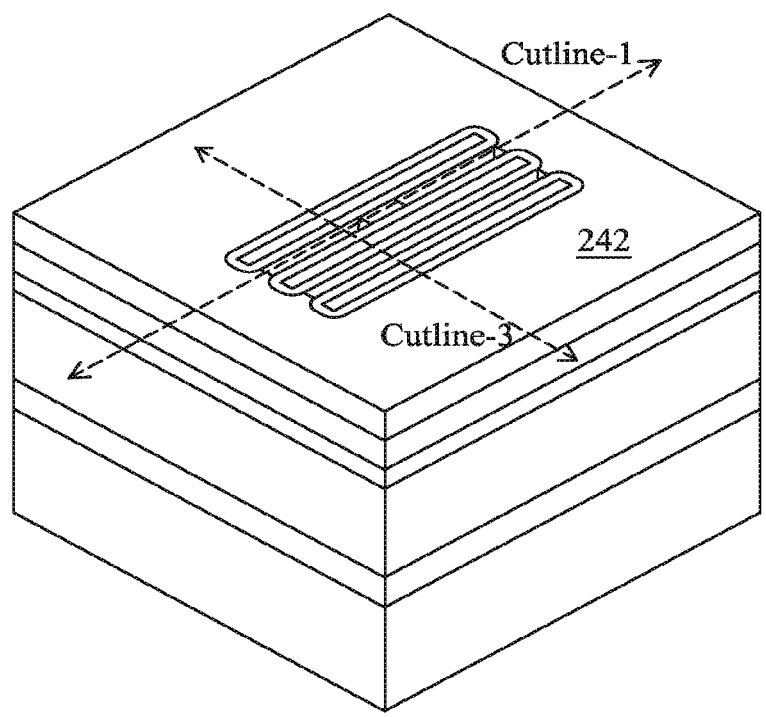
Figure 20B:
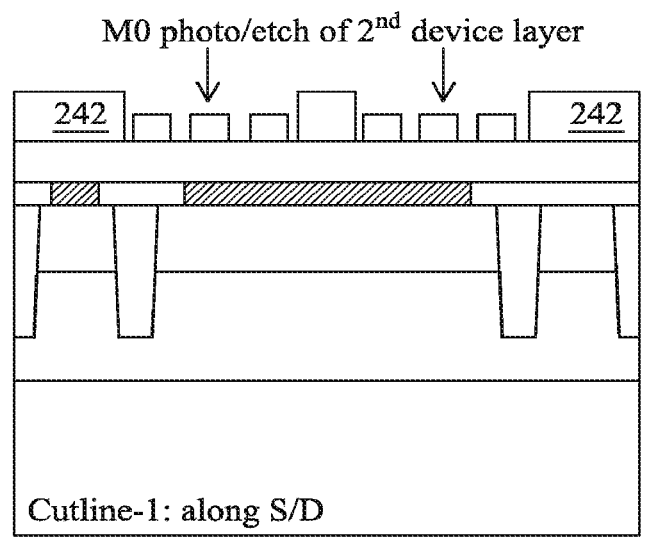
Figure 20C:
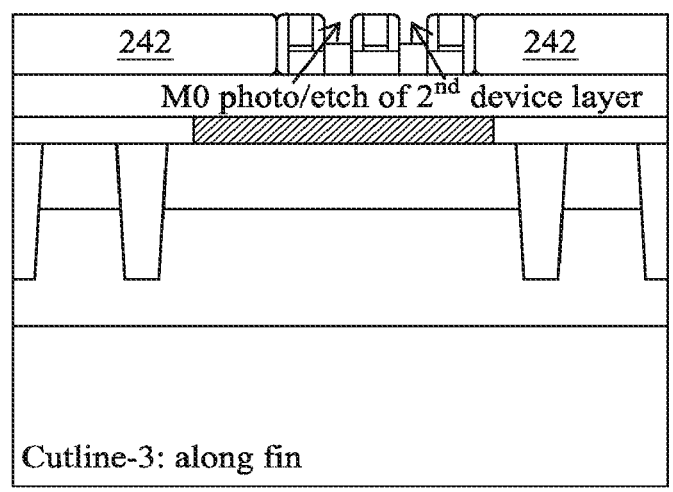

FIG. 20A depicts an isometric view of a portion of the silicon substrate after performing photo resist and etching operations (operation 180 of FIG. 4) to remove the dielectric material above the source/drain regions of the NMOS and PMOS transistors. FIG. 20B provides a cross-sectional view of the multi-layer semiconductor structure from cutline 1 of FIG. 20A, and FIG. 20C provides a cross-sectional view of the multi-layer semiconductor structure from cutline 3 of FIG. 20A. FIGS. 20A-20C illustrate that the dielectric oxide material 242 has been removed above the source/drain regions of the NMOS and PMOS transistors.

Figure 21A:
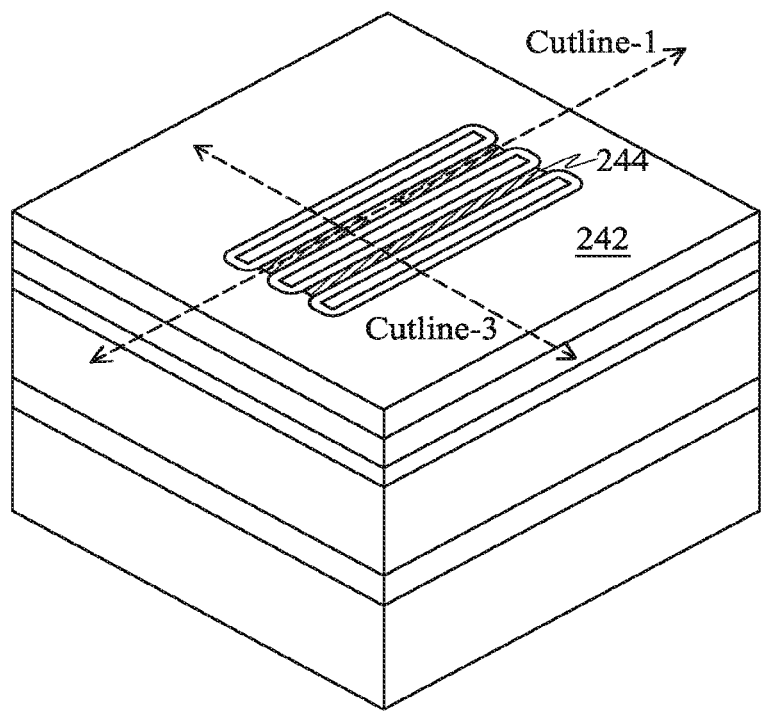
Figure 21B:
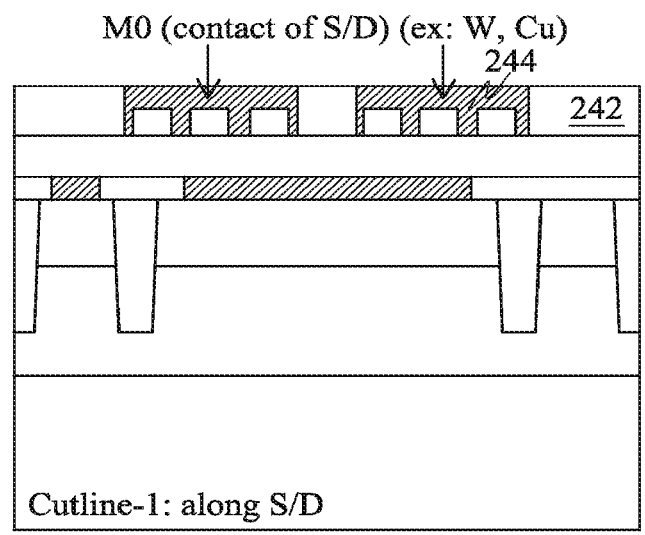
Figure 21C:
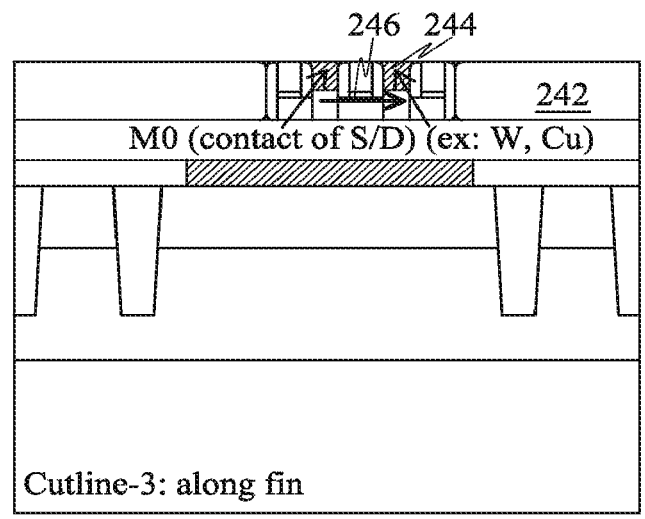

FIG. 21A depicts an isometric view of a completed second layer logic device after salicidation (operation 182 of FIG. 4), metal deposition (operation 184 of FIG. 4), and metal planarizing (operation 186 of FIG. 4), which results in metal contact material 244 being applied above the source/drain regions of the NMOS and PMOS transistors and level with the gate region and nitride spacers. FIG. 21B provides a cross-sectional view of the multi-layer semiconductor structure from cutline 1 of FIG. 21A, and FIG. 21C provides a cross-sectional view of the multi-layer semiconductor structure from cutline 3 of FIG. 21A. FIGS. 21A-21C illustrate metal contact material 244 being applied above the source/drain regions of the NMOS and PMOS transistors and level with the gate region and nitride spacers. The metal material used may include W, Cu or others. FIG. 21C also illustrates the current path 246 for the inverter formed. When the device is operational, current flow is parallel to the gate dielectric surface since the MOSFETs are surface charge inversion devices.

Figure 22A:
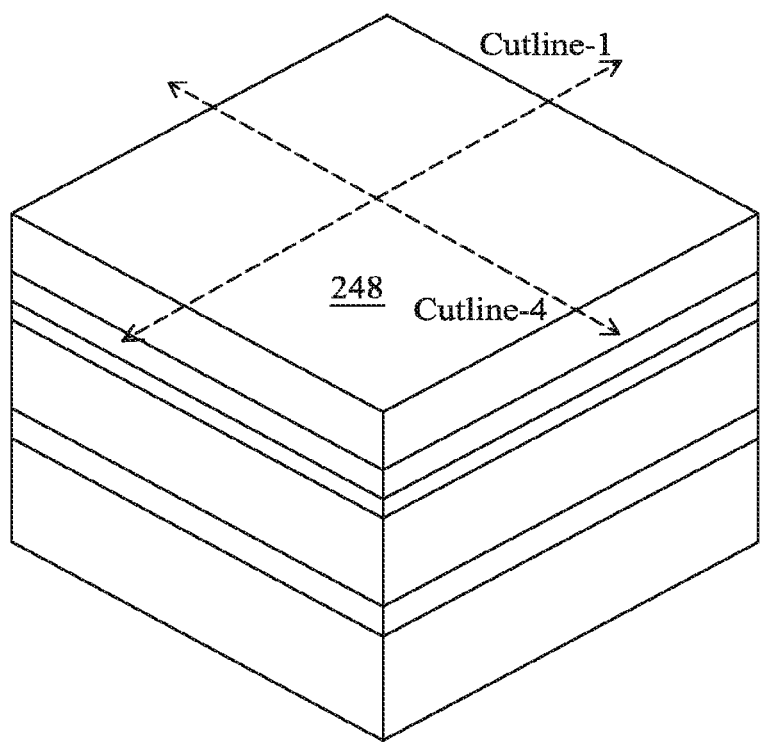
Figure 22B:
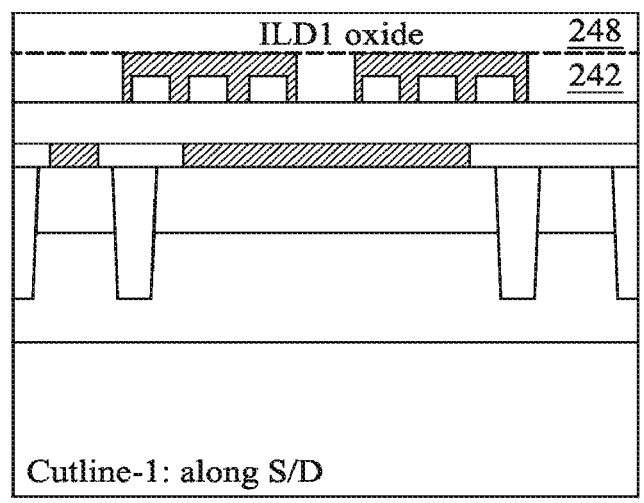
Figure 22C:
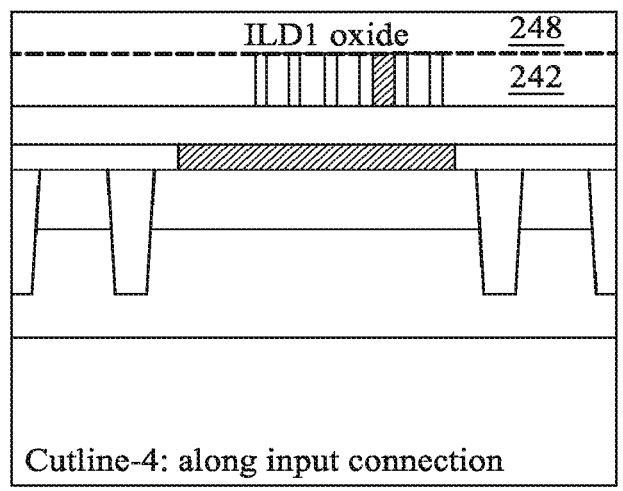

FIG. 22A depicts an isometric view of a portion of the multi-layer semiconductor structure after interlayer dielectric oxide material ("ILD1") deposition (operation 190 of FIG. 5) and the ILD1 oxide planarizing (operation 192 of FIG. 5). FIG. 22B provides a cross-sectional view of the multi-layer semiconductor structure from cutline 1 of FIG. 22A, and FIG. 22C provides a cross-sectional view of the multi-layer semiconductor structure from cutline 4 of FIG. 22A. FIGS. 22A-22C illustrate a planar layer 248 of interlayer dielectric oxide material over the entirety of the second semiconductor device layer.

Figure 23A:
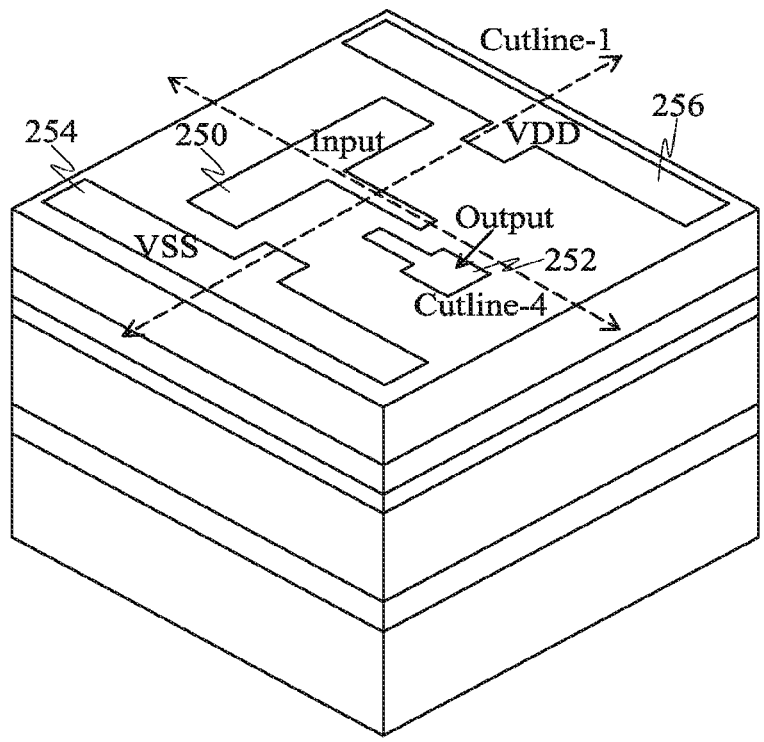
Figure 23B:
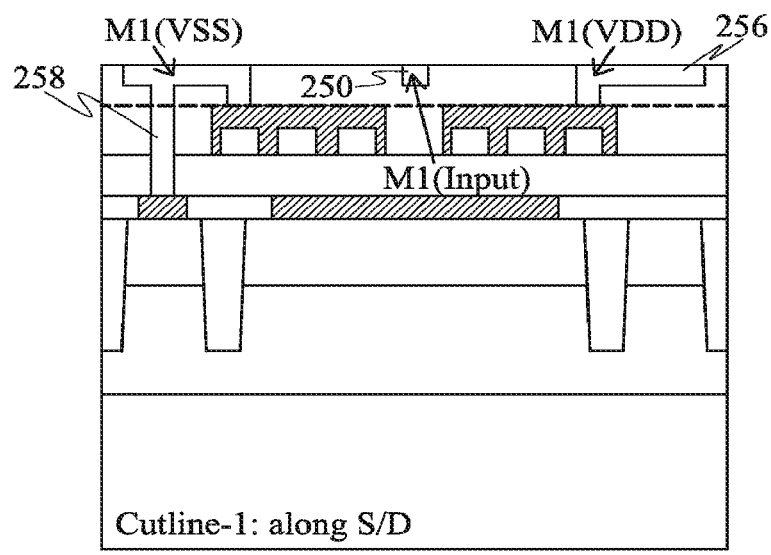
Figure 23C:
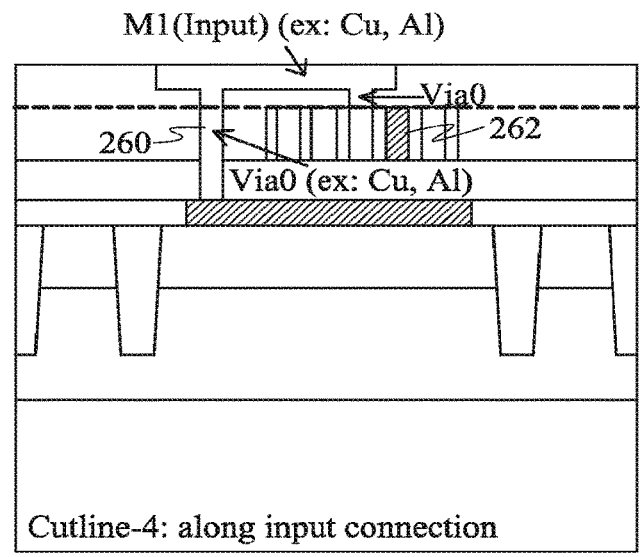

FIG. 23A depicts an isometric view of a portion of the silicon substrate after performing photo resist and etching operations (operation 194 of FIG. 5), metal deposition (operation 196 of FIG. 5), and metal planarizing (operation 198 of FIG. 5), to fabricate metal contact material above the input region 250, output region 252, VSS region 254, and VDD region 256. FIG. 23B provides a cross-sectional view of the multi-layer semiconductor structure from cutline 1 of FIG. 23A and FIG. 23C provides a cross-sectional view of the multi-layer semiconductor structure from cutline 4 of FIG. 23A. FIGS. 23A-23C illustrate metal contact material above the input regions, output regions, VSS regions and VDD regions. The metal material used may include W, Cu or others. FIGS. 21B and 21C also illustrate vias 258, 260, 262 fabricated between metal material in the two semiconductor device layers.

Figure 24:
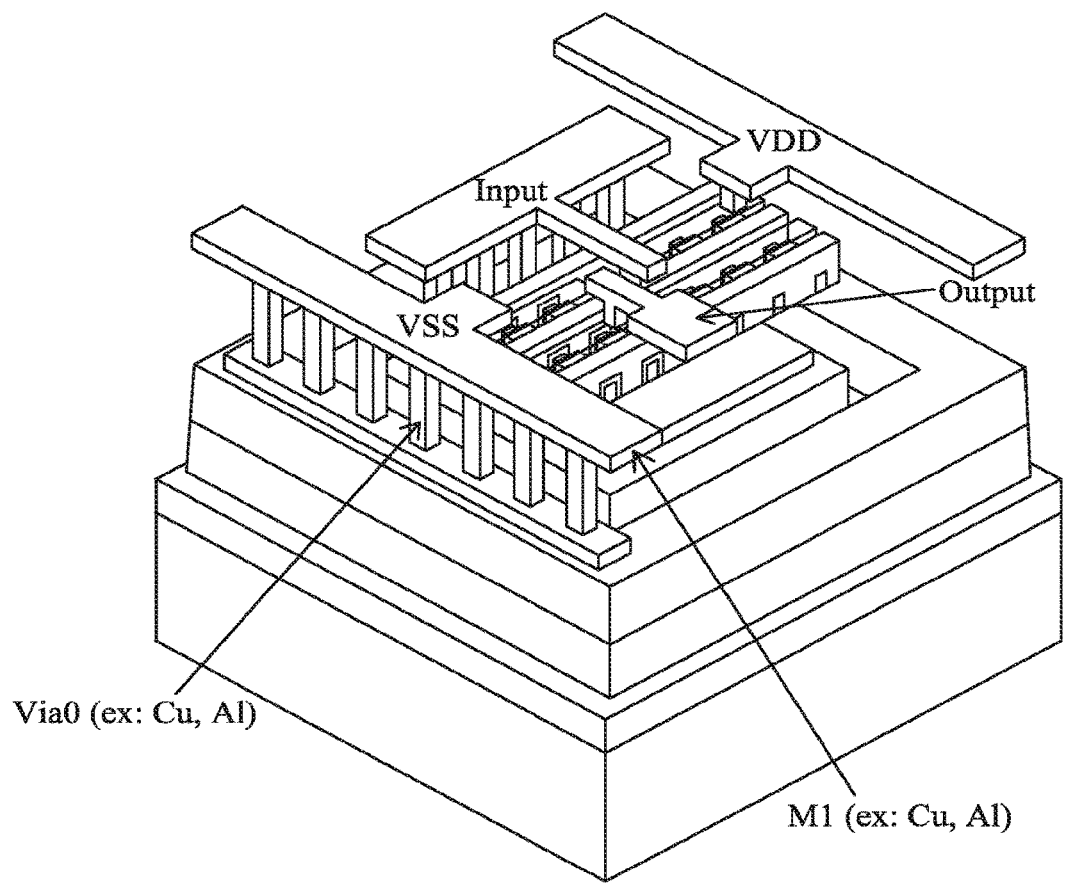

FIG. 24 depicts an isometric view of a completed multi-layer semiconductor structure. In this view, the ILD0, ILD1, buried oxide and nitride spacer are transparent.

Figure 25A:
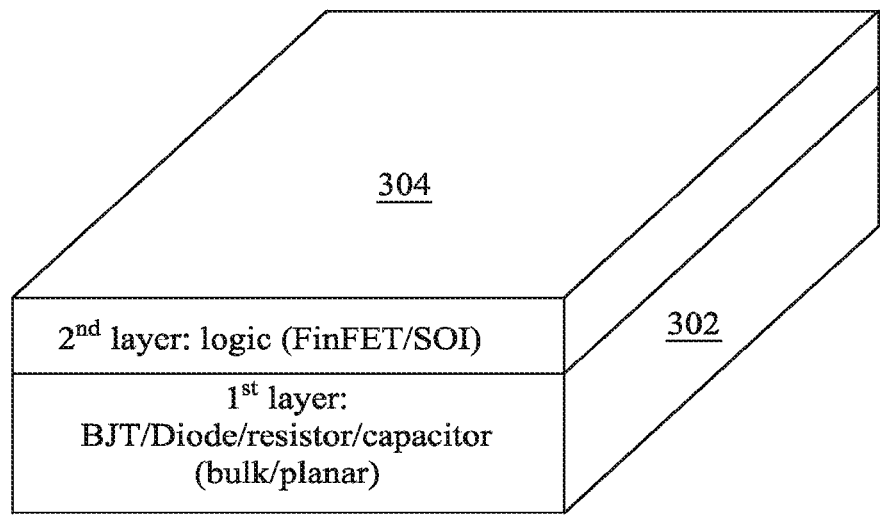
FIGS. 25A and 25B are drawings depicting additional example multi-layer semiconductor structures.
Figure 25B:
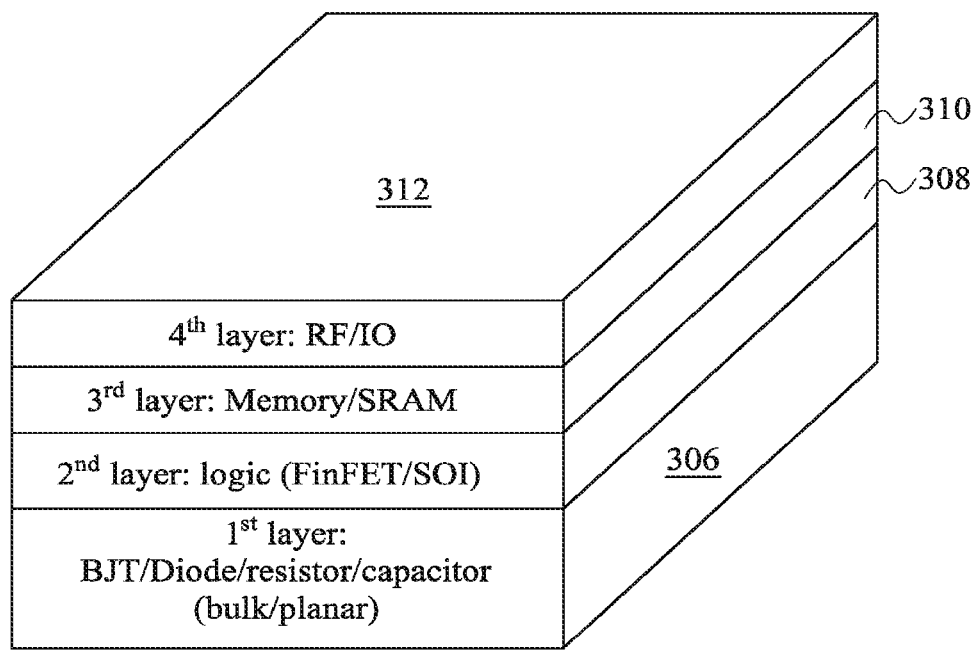

FIGS. 25A and 25B illustrate other example multi-layer semiconductor structures. FIG. 25A illustrates a semiconductor structure wherein planar BJT devices, diodes, resistors, capacitors, or other passive devices are fabricated in the first semiconductor device layer 302 and logic devices such as FinFET devices are fabricated in a second semiconductor device layer 304. FIG. 25B illustrates a semiconductor structure having four semiconductor layers wherein planar BJT devices, diodes, resistors, capacitors, or other passive devices are fabricated in the first semiconductor device layer 306, logic devices such as FinFET devices are fabricated in a second semiconductor device layer 308, Memory devices are fabricated in a third layer 310, and RF/IO circuits are fabricated in a fourth layer 312. In each of the embodiments in FIGS. 25A and 25B, the substrate in first layer is a bulk type and the substrate in the subsequent layers is a SOI type. The substrates in the subsequent layers are bonded to patterned surfaces of the preceding layer.

This written description uses examples to disclose the invention, include the best mode, and also to enable a person skilled in the art to make and use the invention. The patentable scope of the invention may include other examples that occur to those skilled in the art. For example, a semiconductor structure could comprise three or more semiconductor device layers wherein the first semiconductor device layer includes a bulk substrate and the second, third or more layers include a SOI substrate. As another example, a semiconductor structure with multiple semiconductor device layers could include one layer containing planar devices and another layer containing FinFET devices or other structures. In another example, a semiconductor structure with multiple semiconductor device layers could include one layer containing PMOS devices and another layer containing NMOS devices. In another example, a semiconductor structure with multiple semiconductor device layers could include one layer containing logic devices and another layer containing SRAM devices. In another example, a semiconductor structure with multiple semiconductor device layers could include one layer containing logic devices and another layer containing passive devices such as BJT, diodes, and capacitors. In another example, a semiconductor structure with multiple semiconductor device layers could include one layer containing SRAM devices and another layer containing passive devices such as BJT, diodes, and capacitors. Additionally, the first semiconductor layer is not restricted to passive devices. It may also implement, for example, I/O circuits, ESD circuits, Analog circuits, and/or logic circuits. This written description provided an example of a patterned surface. In another embodiment the patterned surface may include other materials and material combinations. In other embodiments, the patterned surface may include other shapes of patterns on the bonding surface.

One of ordinary skill in the art will recognize that the various embodiments may be practiced without one or more of the specific details, or with other replacement and/or additional methods, materials, or components. Well-known structures, materials, or operations may not be shown or described in detail to avoid obscuring aspects of various embodiments of the invention. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the art will recognize various equivalent combinations and substitutions for various components shown in the figures.

What is claimed is:

1. A device comprising:
    a first semiconductor device layer including a first semiconductor device;
    a second semiconductor device layer including a plurality of fins, a plurality of gates disposed over the plurality of fins and gate spacers on sidewalls of the plurality of gates, wherein a first subset of the gate spacers extend to contact a first oxide layer and a second subset of the gate spacers extend to contact at least one fin from the plurality of fins; and
    the first oxide layer disposed between the first semiconductor device layer and the second semiconductor device layer, wherein the first oxide layer electrically insulates the plurality of fins from the first semiconductor device.

2. The device of claim 1, wherein the second semiconductor device layer further includes a second semiconductor device performing a different function than the first semiconductor device.

3. The device of claim 1, further comprising a second oxide layer disposed over the first semiconductor device layer; and
    a metal layer disposed over the first semiconductor device layer, wherein the metal layer and the second oxide layer are disposed between the first oxide layer and the first semiconductor device layer.

4. The device of claim 3, wherein the second oxide layer and the metal layer both physically contact the first oxide layer.

5. The device of claim 3, further comprising a third oxide layer disposed within the first semiconductor device layer, and
    wherein the second oxide layer interfaces with the third oxide layer.

6. The device of claim 1, wherein at least one of the plurality of fins extends to the first oxide layer.

7. The device of claim 1, further comprising a third semiconductor device layer disposed over the second semiconductor device layer, the third semiconductor device layer including a memory device, and
    a fourth semiconductor device layer disposed over the third semiconductor device layer, the fourth semiconductor device layer including an RF/IO circuit.

8. A device comprising:
    a first semiconductor device layer including a first semiconductor device, wherein the first semiconductor device layer includes a top surface having a dielectric portion and a conductive portion;

a dielectric layer disposed directly on the first semiconductor device layer such that dielectric layer physically contacts the dielectric portion and the conductive portion of the top surface of the first semiconductor device layer; and a second semiconductor device layer disposed over the dielectric layer, the second semiconductor device layer including a fin structure, a gate disposed over the fin structure and a gate spacer disposed along a sidewall of the gate such that the gate spacer extends to the dielectric layer, wherein the dielectric layer electrically insulates the fin structure from the first semiconductor device.

9. The device of claim 8, wherein the dielectric layer includes an oxide material.

10. The device of claim 8, wherein the dielectric portion includes an oxide material and the conductive portion includes a metal material.

11. The device of claim 8, wherein the first semiconductor device layer further includes another dielectric layer embedded within the first semiconductor device layer, and
wherein the dielectric portion physically contacts the another dielectric layer.

12. The device of claim 11, wherein the first semiconductor device layer further includes a p-well and n-well, and
wherein the another dielectric layer separated the p-well form the n-well.

13. The device of claim 8, wherein the fin structure physically contacts the dielectric layer.

14. The device of claim 8, further comprising a third semiconductor device layer disposed over the second semiconductor device layer, the third semiconductor device layer including a second semiconductor device performing a different function than the first semiconductor device, and
a fourth semiconductor device layer disposed over the third semiconductor device layer, the fourth semiconductor device layer including a third semiconductor device performing a different function than the second semiconductor device.

15. The device of claim 14, wherein the first semiconductor device performs a function selected from a group consisting of an ESD protection function, a logic function, a memory function, an I/O function, an analog function, a passive device function, and a BJT device function, and
wherein the second semiconductor device performs a memory function, and
wherein the third semiconductor device performs an RF/IO function.

16. A method comprising:
bonding a first semiconductor device layer having a first semiconductor device to a dielectric layer of a second substrate, the second substrate including a channel material layer disposed on the dielectric layer; and
after bonding the first semiconductor device layer to the dielectric layer of the second substrate, forming a second semiconductor device layer on the channel material layer by patterning the channel material layer to form a fin structure on the dielectric layer and forming a gate structure on the fin structure, the second semiconductor device layer including a second semiconductor device that is different from the first semiconductor device.

17. The method of claim 16, wherein the dielectric layer includes an oxide material and the channel material layer includes a semiconductor material.

18. The method of claim 16, wherein the first semiconductor device layer includes a top surface having a dielectric portion and a conductive portion, and
wherein bonding the first semiconductor device layer to the dielectric layer includes bonding the dielectric layer directly to the dielectric portion and the conductive portion of the top surface of the first semiconductor device layer.

19. The method of claim 16, wherein after the forming of the second semiconductor device layer on the channel material layer by patterning the channel material layer to form the fin structure on the dielectric layer, the fin structure extends from the dielectric layer.

20. The method of claim 16, further comprising forming a sidewall spacer along a sidewall of the gate structure and along a sidewall of the fin structure such that that the sidewall spacer extends to the dielectric layer.

* * * * *